(12) United States Patent
Okoshi et al.

(10) Patent No.: US 11,770,508 B2
(45) Date of Patent: Sep. 26, 2023

(54) PROJECTOR

(71) Applicant: SEIKO EPSON CORPORATION, Tokyo (JP)

(72) Inventors: Masayuki Okoshi, Matsumoto (JP); Junya Hayakawa, Azumino (JP); Nobuyuki Otsuki, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 325 days.

(21) Appl. No.: 17/131,079

(22) Filed: Dec. 22, 2020

(65) Prior Publication Data

US 2021/0203892 A1    Jul. 1, 2021

(30) Foreign Application Priority Data

Dec. 25, 2019   (JP) ................................. 2019-234125

(51) Int. Cl.
| | | |
|---|---|---|
| *H04N 9/31* | (2006.01) | |
| *H05K 7/20* | (2006.01) | |
| *G03B 21/16* | (2006.01) | |
| *G03B 21/20* | (2006.01) | |

(52) U.S. Cl.
CPC ........... *H04N 9/3144* (2013.01); *G03B 21/16* (2013.01); *G03B 21/2066* (2013.01); *H04N 9/3105* (2013.01); *H05K 7/20172* (2013.01)

(58) Field of Classification Search
CPC .... H04N 9/3144; H04N 9/3105; G03B 21/16; G03B 21/2066; G03B 21/0006; G03B 33/10; H05K 7/20172; G02B 27/10

USPC .............................. 484/748; 353/119, 57, 61
See application file for complete search history.

(56) References Cited

U.S. PATENT DOCUMENTS

| | | | |
|---|---|---|---|
| 6,203,159 B1* | 3/2001 | Takizawa ............... | G03B 21/16 |
| | | | 353/61 |
| 8,529,656 B2* | 9/2013 | Hashiba ................. | G03B 21/16 |
| | | | 353/57 |
| 9,423,677 B2* | 8/2016 | Mikawa .............. | H04N 9/3144 |
| 2002/0131025 A1* | 9/2002 | Kuroda ................ | G03B 21/006 |
| | | | 353/57 |
| 2003/0090634 A1* | 5/2003 | Tiao ....................... | G03B 21/18 |
| | | | 353/57 |

(Continued)

FOREIGN PATENT DOCUMENTS

| | | |
|---|---|---|
| JP | H10-221779 A | 8/1998 |
| JP | 2004-272092 A | 9/2004 |
| JP | 2012048180 A | 3/2012 |

(Continued)

*Primary Examiner* — John W Miller
*Assistant Examiner* — Sean N. Haiem
(74) *Attorney, Agent, or Firm* — Dority & Manning, P.A.

(57) ABSTRACT

One aspect of a projector according to the present disclosure includes an exterior housing, a first fan, and a first circulator. The exterior housing has a first wall portion, a second wall portion located in a direction opposite to a first direction with respect to the first wall portion, and a third wall portion facing a second direction. The second wall portion has an introduction port, and the third wall portion has a discharge port. The first circulator connects the introduction port and a first suction port of the first fan to each other. A cooling target is located in the first circulator in a direction intersecting with a direction in which air flows from the introduction port to the first suction port.

19 Claims, 8 Drawing Sheets

(56) References Cited

U.S. PATENT DOCUMENTS

2004/0189951 A1* 9/2004 Ogawa .................. G03B 21/28
  353/20
2005/0057730 A1* 3/2005 Okoshi .................. G03B 21/18
  353/61

FOREIGN PATENT DOCUMENTS

| JP | 2013-041134 A | 2/2013 |
| JP | 2015-5673 A | 1/2015 |

* cited by examiner

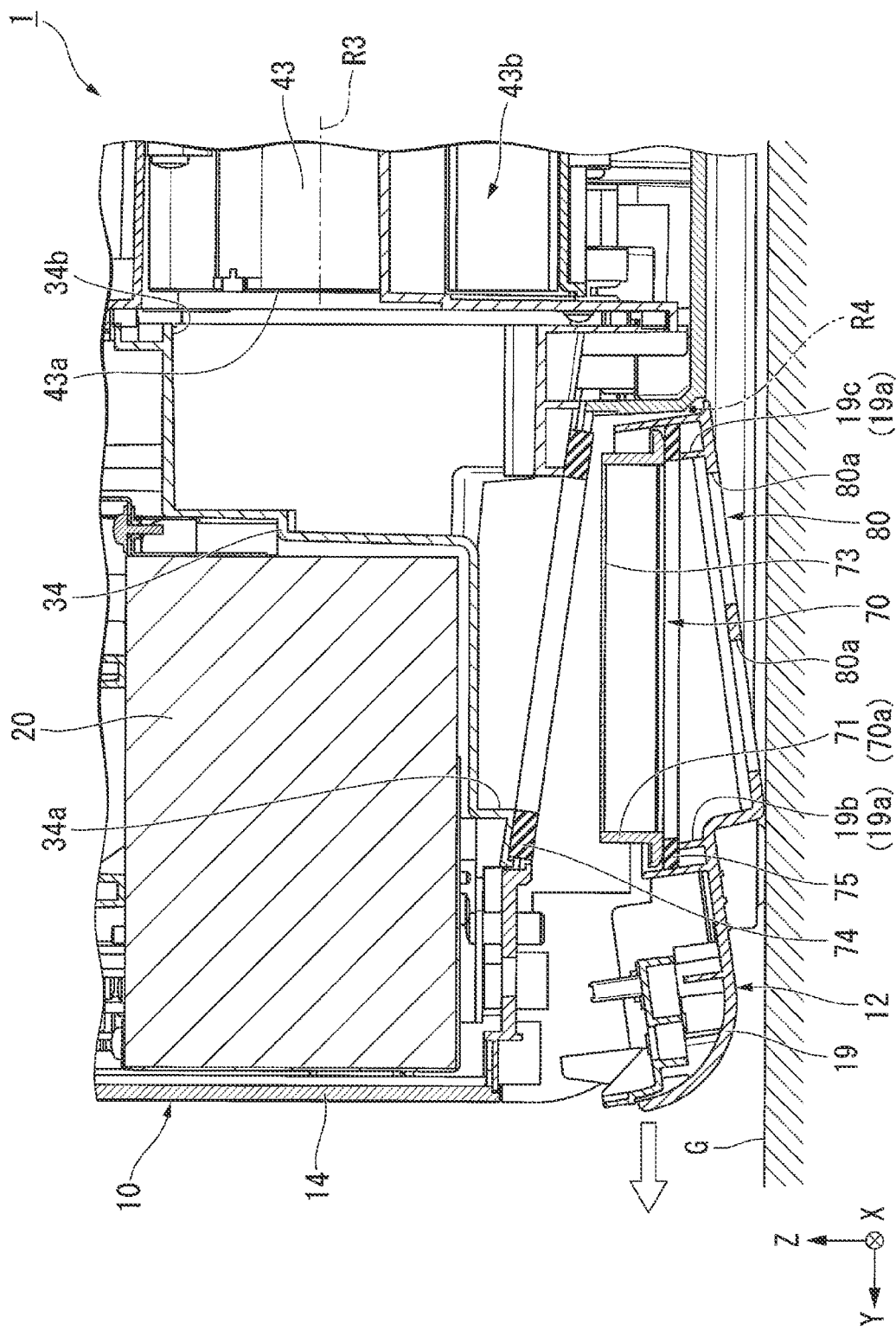

PROJECTOR

The present application is based on, and claims priority from JP Application Serial Number 2019-234125, filed Dec. 25, 2019, the disclosure of which is hereby incorporated by reference herein in its entirety.

BACKGROUND

1. Technical Field

The present disclosure relates to a projector.

2. Related Art

For example, as disclosed in JP-A-2013-041134, a projector is known which includes a projection optical device having a reflection member for reflecting light.

In the above-described projector, in order to cool a cooling target disposed inside an exterior housing of the projector, it is conceivable to adopt a configuration as follows. A fan is provided in a bottom portion of the exterior housing, and air is fetched into the exterior housing from the bottom portion of the exterior housing. However, according to this configuration, a distance from the fan to the cooling target tends to be lengthened, and the cooling target is less likely to be suitably cooled in some cases.

SUMMARY

A projector according to an aspect of the present disclosure includes a cooling target. The projector include a light source that emits light, an optical modulator that modulates the light emitted from the light source in accordance with an image signal, a projection optical device that has a reflection member for reflecting the light modulated by the optical modulator, and projects the light reflected by the reflection member, an exterior housing that forms an exterior of the projector, a first fan that has a first suction port for suctioning air and a first ejection port for ejecting the air suctioned from the first suction port, and a first circulator in which the air suctioned by the first fan circulates. The exterior housing has a first wall portion facing a first direction, and having a projection port through which the light reflected by the reflection member passes, a second wall portion located in a direction opposite to the first direction with respect to the first wall portion, and a third wall portion facing a second direction orthogonal to the first direction. The second wall portion has an introduction port that introduces the air present outside the exterior housing into the exterior housing. The third wall portion has a discharge port that discharges the air present inside the exterior housing to an outside of the exterior housing. The first circulator is located along the first direction between the second wall portion and the first fan, inside the exterior housing, extends in the first direction, and guides the air introduced into the exterior housing from the introduction port to the first suction port. The cooling target includes a first cooling target to which the air ejected from the first ejection port is fed. At least a portion of the first cooling target is located in a third direction intersecting with the first direction with respect to the first fan. The first ejection port is open in the third direction.

BRIEF DESCRIPTION OF THE DRAWINGS

FIG. 8 is a cross-sectional view illustrating a part of a procedure when a lid portion according to the present embodiment is detached.

DESCRIPTION OF EXEMPLARY EMBODIMENTS

Hereinafter, a projector according to an embodiment of the present disclosure will be described with reference to the drawings. A scope of the present disclosure is not limited to the following embodiments, and can be changed in any desired way within the scope of the technical idea of the present disclosure. In addition, in the following drawings, in order to facilitate understanding of each configuration, a scale and the number of respective structures may be different from a scale and the number of actual structures.

A Z-axis direction illustrated in each drawing is an upward-downward direction in which a +Z-direction (first direction) represents an upper side and a −Z-direction represents a lower side. An X-axis direction and a Y-axis direction are horizontal directions orthogonal to the Z-axis direction, and are directions orthogonal to each other. In the following description, a direction parallel to the Z-axis direction will be referred to as an upward-downward direction Z, a direction parallel to the X-axis direction will be referred to as a forward-rearward direction X, and a direction parallel to the Y-axis direction will be referred to as a rightward-leftward direction Y. In addition, a +Y-direction in the Y-axis direction will be referred to as a left side, and a −Y-direction (second direction) in the Y-axis direction will be referred to as a right side. In addition, a +X-direction in the X-axis direction will be referred to as a front side, and a −X-direction (third direction) in the X-axis direction will be referred to as a rear side.

Figure 1:
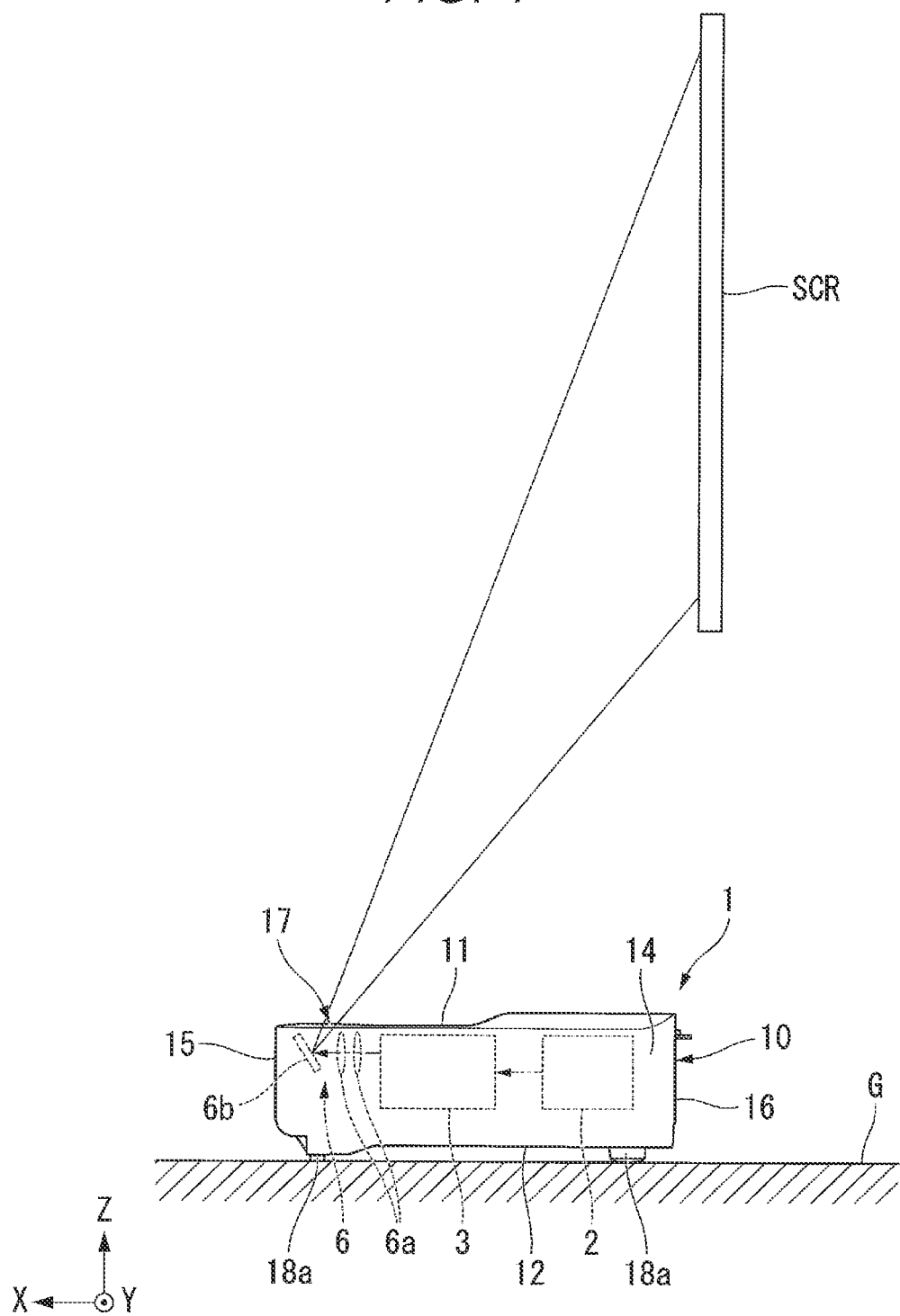
FIG. 1 is a side view when a projector according to the present embodiment is viewed in a rightward-leftward direction.
Figure 2:
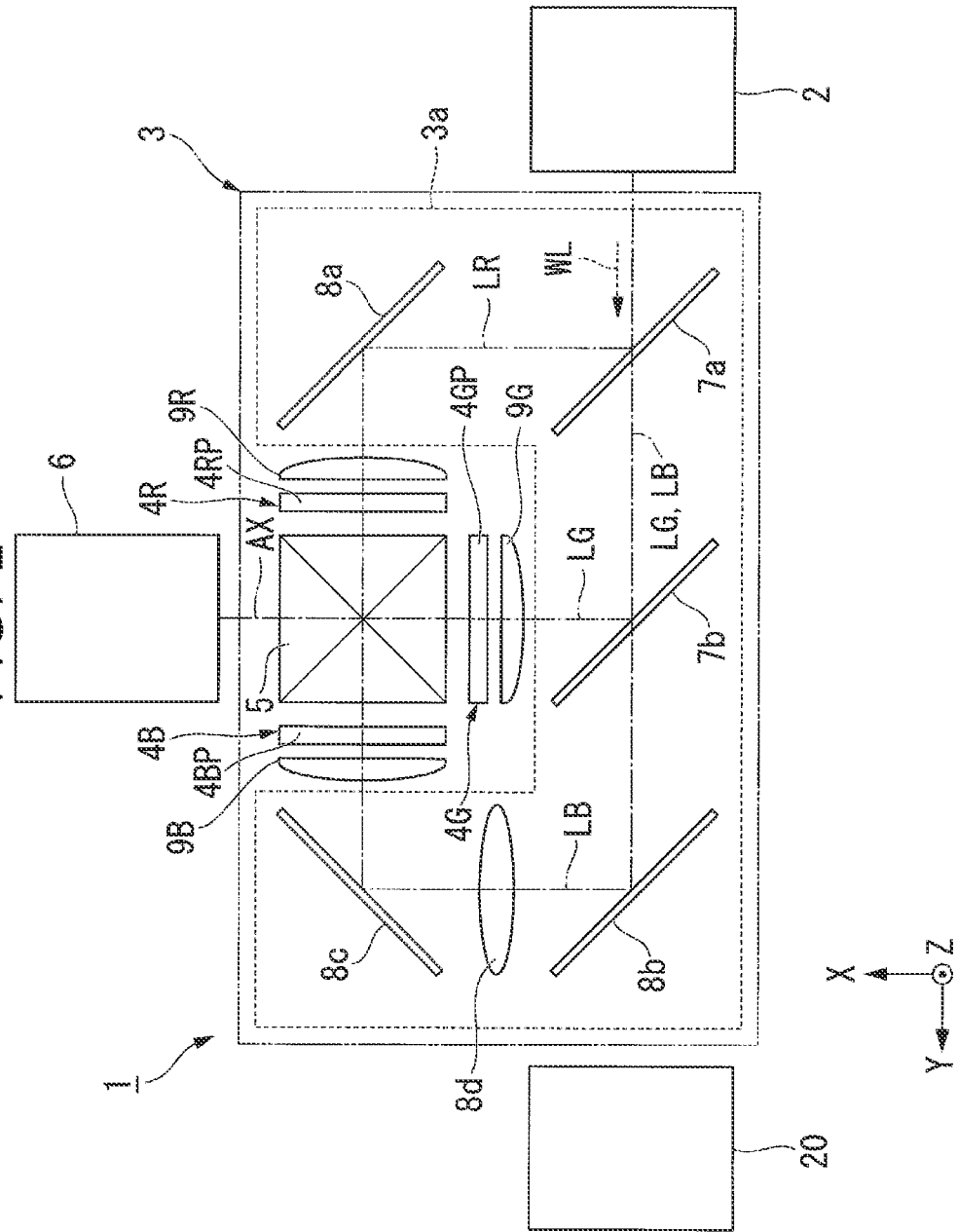
FIG. 2 is a schematic configuration diagram illustrating the projector according to the present embodiment.

FIG. 1 is a side view when a projector 1 according to the present embodiment is viewed in the rightward-leftward direction Y. FIG. 2 is a schematic configuration diagram illustrating the projector 1 according to the present embodiment. As illustrated in FIG. 1, the projector 1 according to the present embodiment is a stationary-type projector used by being installed at an installation surface G, and is a short focus projector. The installation surface G is a surface facing upward. For example, the installation surface G is a flat surface orthogonal to the upward-downward direction Z. The projector 1 includes a light source 2, a light guide system 3, a projection optical device 6, and an exterior housing 10.

The light source 2 emits illumination light WL adjusted to have a substantially uniform illuminance distribution toward a color separation optical system 3a. For example, the light source 2 is a semiconductor laser. The light guide system 3 guides the light emitted from the light source 2 to the projection optical device 6. As illustrated in FIG. 2, in the present embodiment, the light guide system 3 is located along the rightward-leftward direction Y between the light source 2 and a power supply device 20 (to be described later). The light guide system 3 has the color separation optical system 3a, an optical modulation unit 4R, an optical modulation unit 4G, an optical modulation unit 4B, and a photosynthesis optical system 5. The optical modulation unit 4R has an optical modulator 4RP. The optical modulation unit 4G has an optical modulator 4GP. The optical modulation unit 4B has an optical modulator 4BP.

The color separation optical system 3a separates the illumination light WL emitted from the light source 2 into red light LR, green light LG and blue light LB. The color separation optical system 3a includes a first dichroic mirror 7a, a second dichroic mirror 7b, a first reflection mirror 8a, a second reflection mirror 8b, a third reflection mirror 8c, and a relay lens 8d.

The first dichroic mirror 7a separates the illumination light WL emitted from the light source 2 into the red light LR and mixed light of the green light LG and the blue light LB. The first dichroic mirror 7a has a characteristic in which the red light LR is reflected and the green light LG and the blue light LB are transmitted. The second dichroic mirror 7b separates the mixed light of the green light LG and the blue light LB into the green light LG and the blue light LB. The second dichroic mirror 7b has a characteristic in which the green light LG is reflected and the blue light LB is transmitted.

The first reflection mirror 8a is disposed in an optical path of the red light LR, and reflects the red light LR reflected by the first dichroic mirror 7a toward the optical modulator 4RP. The second reflection mirror 8b and the third reflection mirror 8c are disposed in an optical path of the blue light LB, and guide the blue light LB transmitted through the second dichroic mirror 7b to the optical modulator 4BP.

Each of the optical modulator 4RP, the optical modulator 4GP, and the optical modulator 4BP is configured to include a liquid crystal panel. The optical modulator 4RP modulates the red light LR of the light emitted from the light source 2 in accordance with an image signal. The optical modulator 4GP modulates the green light LG of the light emitted from the light source 2 in accordance with an image signal. The optical modulator 4BP modulates the blue light LB of the light emitted from the light source 2 in accordance with an image signal. In this manner, each of the optical modulators 4RP, 4GP, and 4BP forms image light corresponding to each color light. Although not illustrated, polarizing plates are disposed at a light incident side and a light emitting side of the respective optical modulators 4RP, 4GP, and 4BP.

A field lens 9R for collimating the red light LR incident on the optical modulator 4RP is disposed at the light incident side of the optical modulator 4RP. A field lens 9G for collimating the green light LG incident on the optical modulator 4GP is disposed at the light incident side of the optical modulator 4GP. A field lens 9B for collimating the blue light LB incident on the optical modulator 4BP is disposed at the light incident side of the optical modulator 4BP.

The photosynthesis optical system 5 is configured to include a substantially cubic cross dichroic prism.

The photosynthesis optical system 5 combines the image light of the respective colors from the optical modulators 4RP, 4GP, and 4BP.

The photosynthesis optical system 5 emits the combined image light toward the projection optical device 6. In the present embodiment, the photosynthesis optical system 5 emits the light in the +X-direction.

In the present embodiment, the projection optical device 6 is located in the +X-direction with respect to the photosynthesis optical system 5.

As illustrated in FIG. 1, the projection optical device 6 magnifies and projects the light emitted from the light guide system 3 toward a screen SCR. In the present embodiment, the light emitted from the light guide system 3 is the image light combined by the photosynthesis optical system 5, that is, the light modulated by the optical modulators 4RP, 4GP, and 4BP. Since the light is projected from the projection optical device 6, an enlarged color image (picture) is displayed on the screen SCR. The screen SCR is disposed at the rear side and the upper side of the projector 1.

The projection optical device 6 has a projection lens 6a and a reflection member 6b. The plurality of projection lenses 6a are provided, for example. The light emitted from the light guide system 3 is incident on the plurality of projection lenses 6a. The reflection member 6b is a reflection mirror that reflects the light emitted from the light guide system 3 and passing through the plurality of projection lenses 6a. That is, the reflection member 6b reflects the light modulated by the optical modulators 4RP, 4GP, and 4BP. In the present embodiment, the light incident in the −X-direction is reflected by the reflection member 6b in the −X-direction and the +Z-direction. The light reflected by the reflection member 6b is emitted outward of the exterior housing 10 from a projection port 17 provided in the exterior housing 10, and is projected on the screen SCR. In this way, the projection optical device 6 projects the light reflected by the reflection member 6b.

Figure 3:
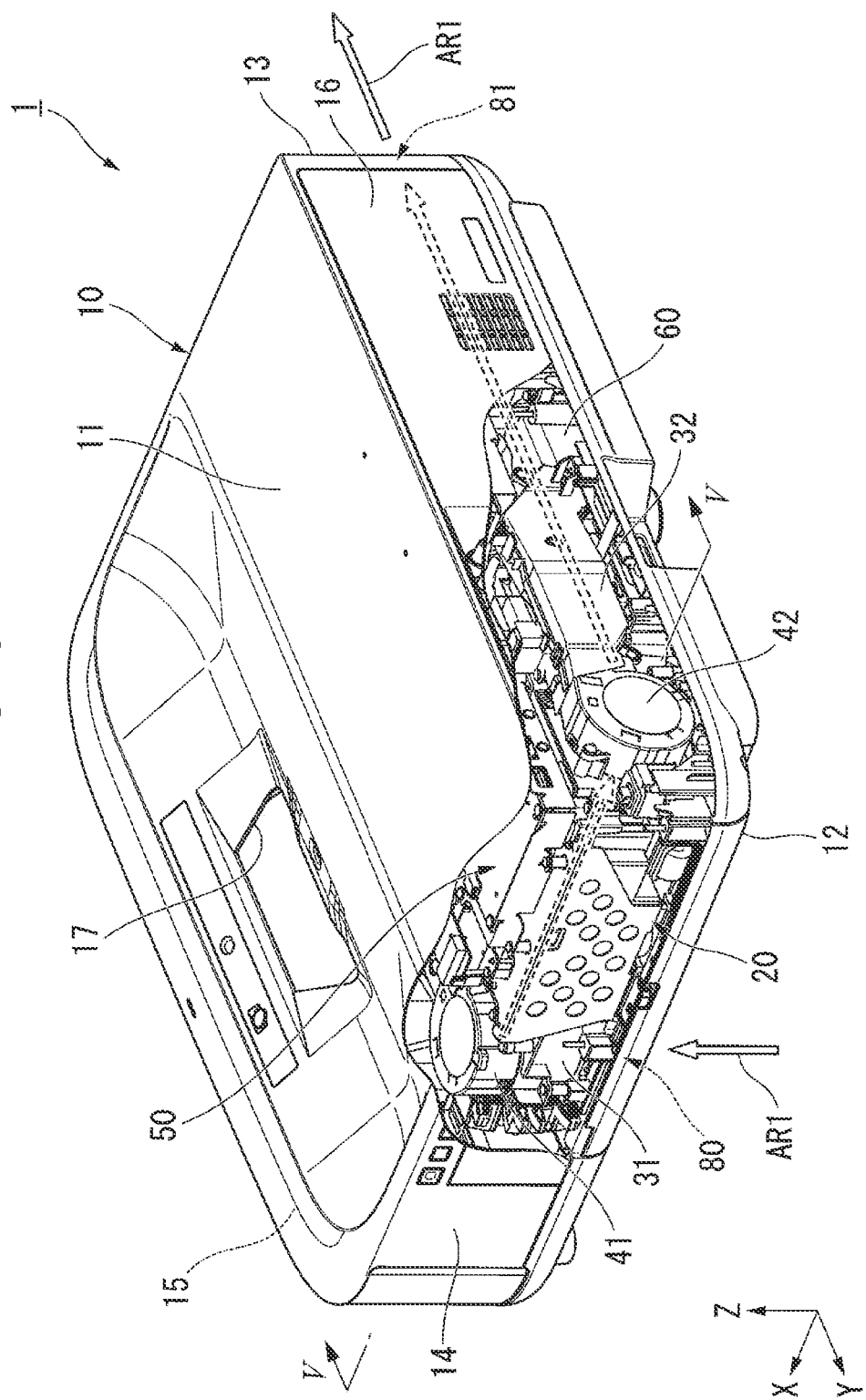
FIG. 3 is a perspective view illustrating the projector according to the present embodiment, and is a cutaway view illustrating a part of an exterior housing.
Figure 4:
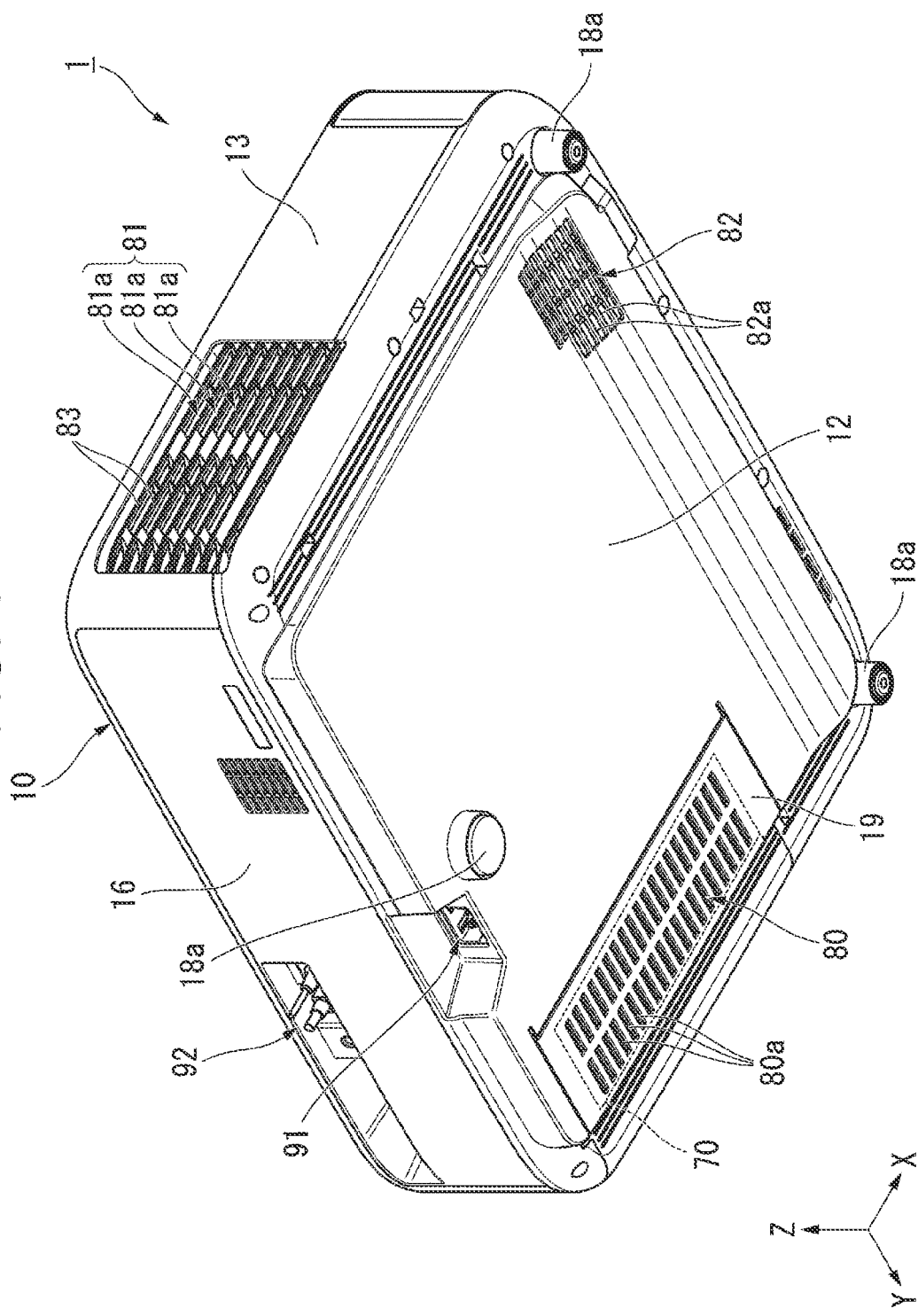
FIG. 4 is a perspective view when the projector according to the present embodiment is viewed at another angle.
Figure 5:
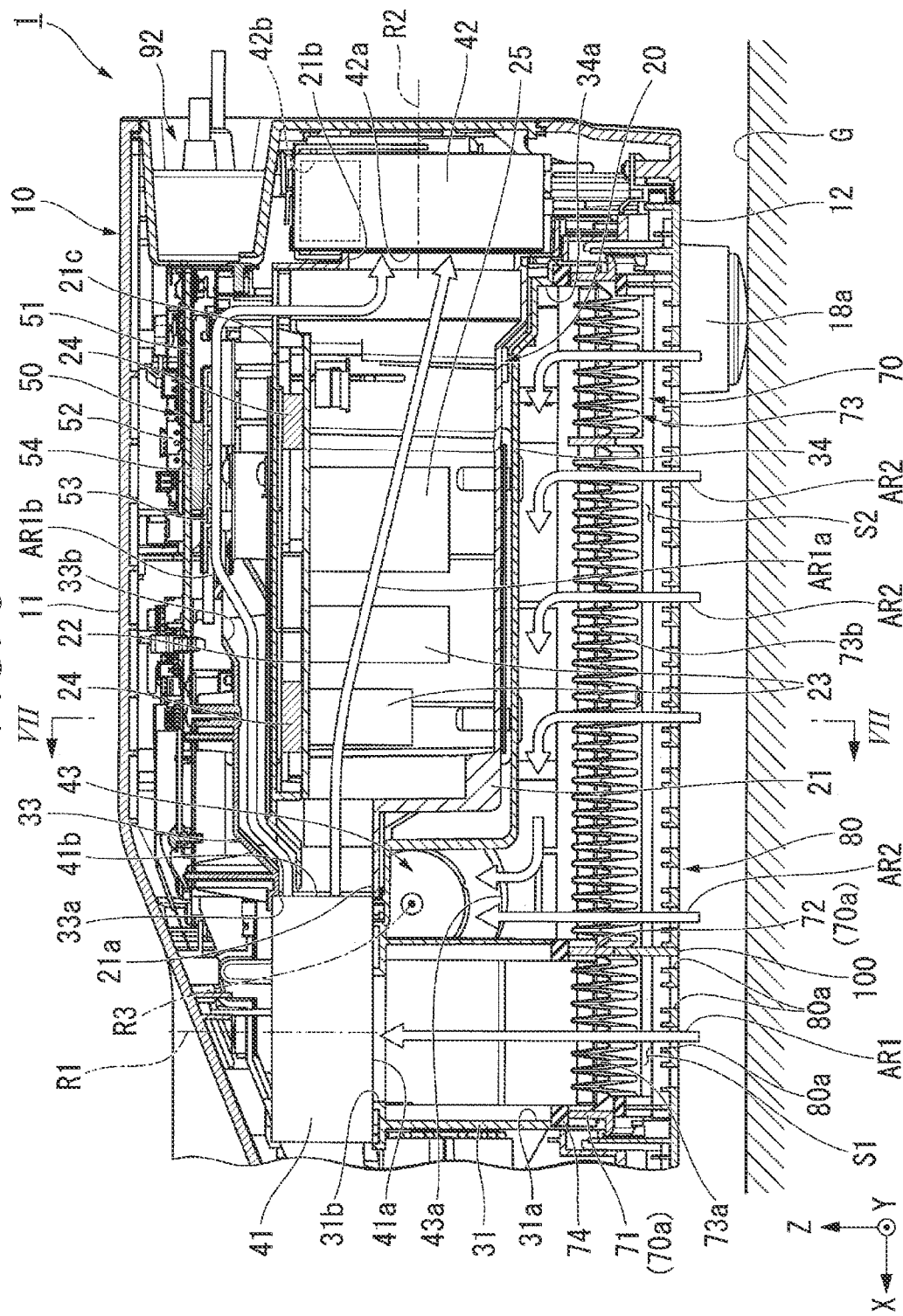
FIG. 5 is a cross-sectional view illustrating a part of the projector according to the present embodiment, and is a cross-sectional view taken along line V-V illustrated in FIG. 3.
Figure 6:
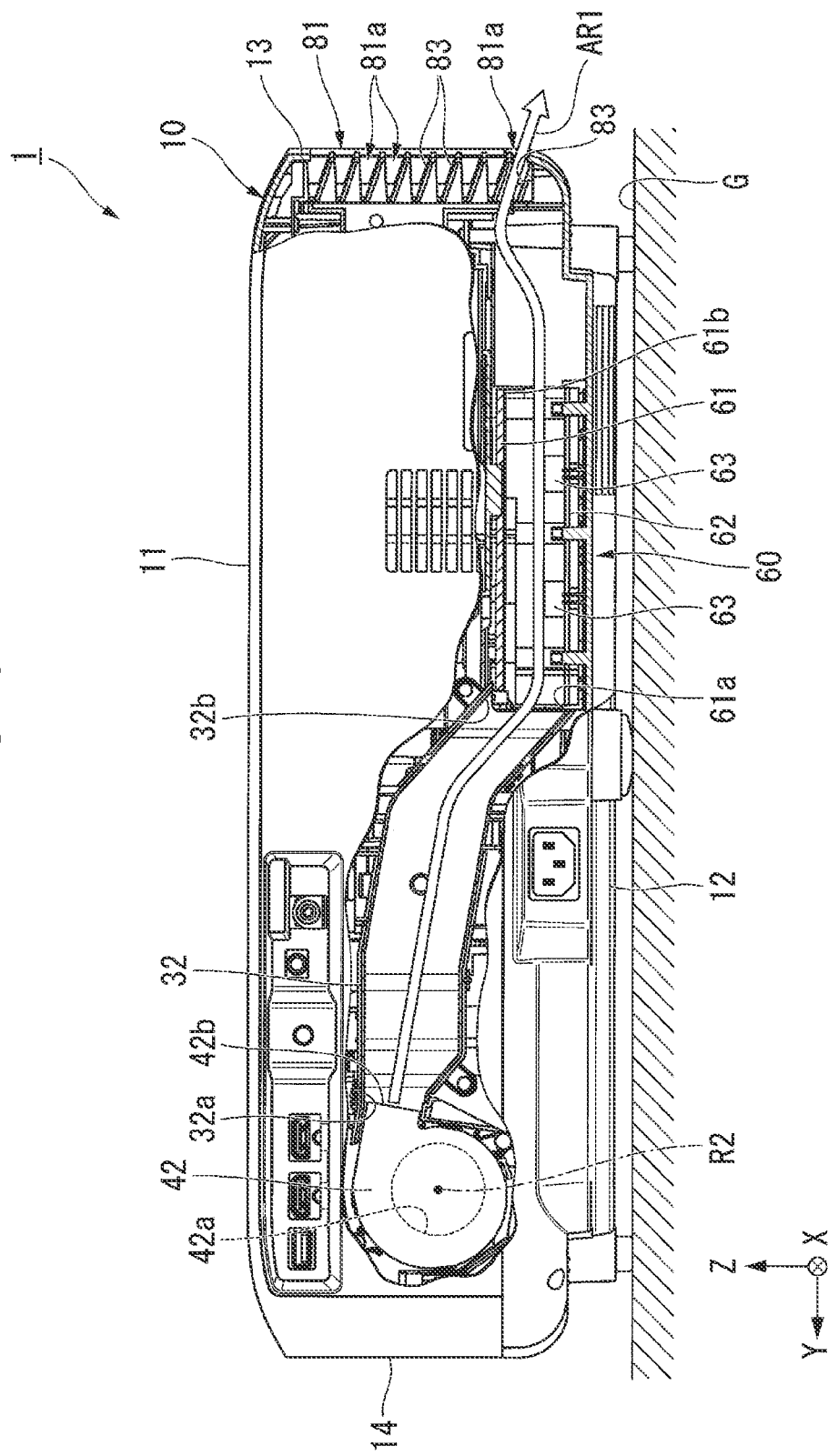
FIG. 6 is a view when the projector according to the present embodiment is viewed from a rear side, and is a cutaway view illustrating a part of the exterior housing.
Figure 7:
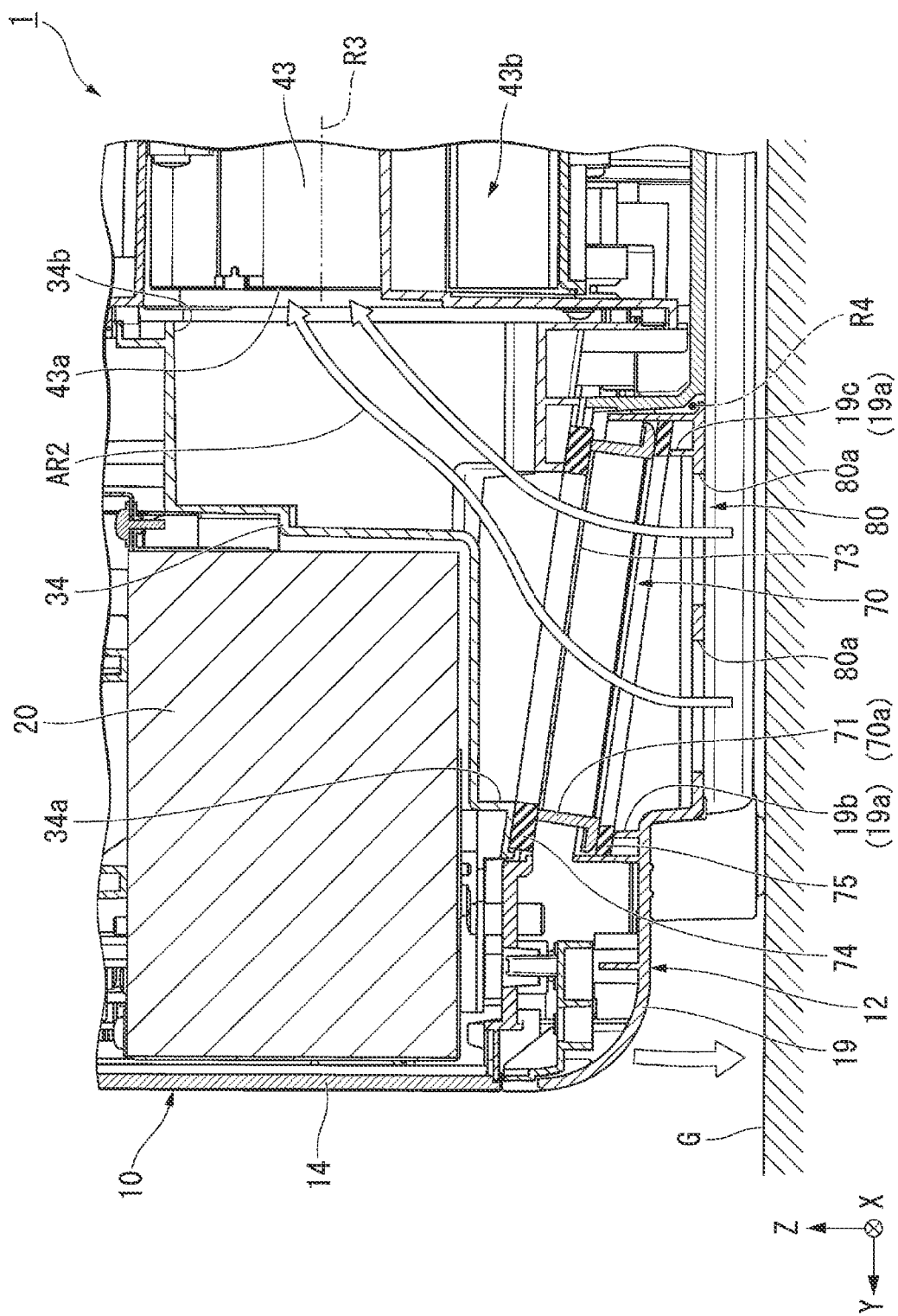
FIG. 7 is a cross-sectional view illustrating a part of the projector according to the present embodiment, and is a cross-sectional view taken along line VII-VII illustrated in FIG. 5.

FIG. 3 is a perspective view illustrating the projector 1, and is a cutaway view illustrating a part of the exterior housing 10. FIG. 4 is a perspective view when the projector 1 is viewed at another angle. FIG. 5 is a cross-sectional view illustrating apart of the projector 1, and is a cross-sectional view taken along line V-V illustrated in FIG. 3. FIG. 6 is a view when the projector 1 is viewed in the −X-direction, and is a cutaway view illustrating a part of the exterior housing 10. FIG. 7 is a cross-sectional view illustrating a part of the projector 1, and is a cross-sectional view taken along line VII-VII illustrated in FIG. 5. FIG. 8 is a cross-sectional view illustrating a part of a procedure when a lid portion 19 (to be described later) is detached.

The exterior housing 10 forms an exterior of the projector 1. As illustrated in FIGS. 3 and 4, the exterior housing 10 has a substantially rectangular parallelepiped box shape including a plurality of wall portions. The exterior housing 10 has a first wall portion 11, a second wall portion 12, a third wall portion 13, a fourth wall portion 14, a fifth wall portion 15, and a sixth wall portion 16.

The first wall portion 11 faces the +Z-direction in the upward-downward direction Z, and the second wall portion 12 faces the −Z-direction in the upward-downward direction Z. The third wall portion 13 faces the −Y-direction in the rightward-leftward direction Y intersecting with the upward-downward direction Z, and the fourth wall portion 14 faces the +Y-direction in the rightward-leftward direction Y. The fifth wall portion 15 faces the +X-direction in the forward-rearward direction X intersecting with the upward-downward direction Z, and the sixth wall portion 16 faces the −X-direction in the forward-rearward direction X. The first wall portion 11 and the second wall portion 12 are disposed at an interval in the upward-downward direction Z. The third wall portion 13 and the fourth wall portion 14 are disposed at an interval in the rightward-leftward direction Y. The fifth wall portion 15 and the sixth wall portion 16 are disposed at an interval in the forward-rearward direction X. The third wall portion 13, the fourth wall portion 14, the fifth wall portion 15, and the sixth wall portion 16 are side wall portions.

In the present specification, for example, description of "a certain wall portion of the exterior housing faces a certain direction" may mean that an orientation of at least half of an outer wall surface of a certain wall portion includes a component facing a certain direction. Description of "the orientation of the outer wall surface of the certain wall portion includes the component facing the certain direction" may mean that the outer wall surface of the certain wall portion is visible when the certain wall portion is viewed along the certain direction from the outside of the exterior housing. That is, for example, description of "the first wall portion 11 faces the +Z-direction" may mean that at least the half of the upper wall surface of the first wall portion 11 is visible when the first wall portion 11 is viewed in the +Z-direction, may also mean that an upper wall surface of the first wall portion 11 is a surface inclined in the +Z-direction, or may also mean that a portion of the upper wall surface of the first wall portion 11 includes a portion facing a direction orthogonal to the +Z-direction.

As illustrated in FIG. 3, the first wall portion 11 is located in the +Z-direction, among the wall portions that form the exterior housing 10. The first wall portion 11 faces the +Z-direction (first direction). An outer shape of the first wall portion 11 is a substantially square shape when viewed from above. The first wall portion 11 has a projection port 17 through which the light reflected by the reflection member 6b passes. In the present embodiment, the projection port 17 is provided in a central portion of a front end portion of the first wall portion 11 in the rightward-leftward direction Y. The projection port 17 is open obliquely upward and rearward.

As illustrated in FIG. 4, the second wall portion 12 is located in the −Z-direction among the wall portions that form the exterior housing 10. That is, the second wall portion 12 is located in the −Z-direction opposite to the +Z-direction with respect to the first wall portion 11. The second wall portion 12 faces the −Z-direction. An outer shape of the second wall portion 12 is a substantially square shape when viewed from below. The second wall portion 12 has a first introduction port (introduction port) 80 and a second introduction port 82 which introduce the air present outside the exterior housing 10 into the exterior housing 10.

In the present embodiment, the first introduction port 80 is provided in a portion in the −X-direction, in an end portion of the second wall portion 12 in the +Y-direction. For example, the first introduction port 80 is configured to include a plurality of hole portions 80a penetrating the second wall portion 12 in the upward-downward direction Z. For example, the hole portion 80a is a rectangular hole that is long in the rightward-leftward direction Y. In the present embodiment, two rows in which multiple hole portions 80a are aligned in the forward-rearward direction X are aligned in the rightward-leftward direction Y.

As illustrated in FIG. 5, the air introduced into the exterior housing 10 from the first introduction port 80 includes air AR1 suctioned by a first fan 41 and air AR2 suctioned by a third fan 43 (to be described later). The air AR1 suctioned by the first fan 41 is introduced into the exterior housing 10 from a portion in the +X-direction of the first introduction port 80. The air AR2 suctioned by the third fan 43 is introduced into the exterior housing 10 from a portion in the −X-direction of the first introduction port 80. A region of the first introduction port 80 into which the air AR1 is introduced is smaller than a region of the first introduction port 80 into which the air AR2 is introduced.

In the present embodiment, as illustrated in FIG. 4, the second introduction port 82 is provided in an end portion in the +X-direction, in an end portion in the −Y-direction of the second wall portion 12. For example, the second introduction port 82 is configured to include a plurality of hole portions 82a penetrating the second wall portion 12 in the upward-downward direction Z. The hole portion 82a is a rectangular hole that is long in the rightward-leftward direction Y. For example, the plurality of hole portions 82a are disposed in a matrix form along the forward-rearward direction X and the rightward-leftward direction Y.

The second wall portion 12 has a plurality of leg portions 18a. The plurality of leg portions 18a protrude from the second wall portion 12 in the −Z-direction. As illustrated in FIG. 1, each lower end portion of the leg portions 18a is in contact with the installation surface G. The second wall portion 12 is disposed with a gap from the installation surface G in the +Z-direction by the leg portions 18a. As illustrated in FIG. 4, for example, the plurality of leg portions 18a include one leg portion 18a provided in a central portion in the rightward-leftward direction Y in a front end portion of the second wall portion 12, and a pair of leg portions 18a provided in both end portions in the rightward-leftward direction Y in a rear end portion of the second wall portion 12.

The third wall portion 13 is located in the −Y-direction among the wall portions that form the exterior housing 10. The third wall portion 13 faces the −Y-direction (second direction) orthogonal to the +Z-direction. An outer shape of the third wall portion 13 is a substantially rectangular shape that is long in the forward-rearward direction X when viewed from the right side. The third wall portion 13 connects a right side edge portion of the first wall portion 11 and a right side edge portion of the second wall portion 12 to each other in the upward-downward direction Z. The third wall portion 13 has a discharge port 81 for discharging the air present inside the exterior housing 10 which includes the air introduced into the exterior housing 10 from the first introduction port 80 to the outside of the exterior housing 10. In the present embodiment, the discharge port 81 discharges the air AR1 suctioned by the first fan 41 (to be described later) in the air introduced into the exterior housing 10 from the first introduction port 80, to the outside of the exterior housing 10.

The air AR2 suctioned by the third fan 43 (to be described later) in the air introduced into the exterior housing 10 from the first introduction port 80 may be discharged from the discharge port 81, or may be discharged from another discharge port provided in addition to the discharge port 81.

In the present embodiment, the discharge port 81 is provided in a portion of the third wall portion 13 in the +X-direction. A plurality of guide plates 83 are disposed in the discharge port 81. The plurality of guide plates 83 extend in the forward-rearward direction X. As illustrated in FIG. 6, each plate surface of the plurality of guide plates 83 is inclined to be located at the lower side as the plate surface faces the −Y-direction. The plurality of guide plates 83 are aligned at an interval in the upward-downward direction Z. The plurality of guide plates 83 divide the discharge port 81 into a plurality of hole portions 81a along the upward-downward direction Z. The air discharged from the discharge port 81 is discharged obliquely rightward and downward along the guide plate 83.

The fourth wall portion 14 is located in the +Y-direction among the wall portions that form the exterior housing 10. The fourth wall portion 14 faces the +Y-direction. As illustrated in FIG. 1, an outer shape of the fourth wall portion 14 is a substantially rectangular shape that is long in the forward-rearward direction X when viewed from the left side. The fourth wall portion 14 connects a left side edge portion of the first wall portion 11 and a left side edge portion of the second wall portion 12 to each other in the upward-downward direction Z.

The fifth wall portion 15 is located at the front side among the wall portions that form the exterior housing 10. The fifth wall portion 15 faces the +X-direction. An outer shape of the fifth wall portion 15 is a substantially rectangular shape that is long in the rightward-leftward direction Y when viewed from the front side. The fifth wall portion 15 connects a front side edge portion of the first wall portion 11 and a front side edge portion of the second wall portion 12 to each other in the upward-downward direction Z. The fifth wall portion 15 connects a front side edge portion of the third wall portion 13 and a front side edge portion of the fourth wall portion 14 to each other in the rightward-leftward direction Y.

As illustrated in FIG. 4, the sixth wall portion 16 is located at the rear side among the wall portions that form the exterior housing 10. The sixth wall portion 16 faces the −X-direction (third direction) intersecting with the +Z-direction. An outer shape of the sixth wall portion 16 is a substantially rectangular shape that is long in the rightward-leftward direction Y when viewed from the rear side. The sixth wall portion 16 connects a rear side edge portion of the first wall portion 11 and a rear side edge portion of the second wall portion 12 to each other in the upward-downward direction Z. The sixth wall portion 16 connects a rear side edge portion of the third wall portion 13 and a rear side edge portion of the fourth wall portion 14 to each other in the rightward-leftward direction Y.

The sixth wall portion 16 has a first connector portion 91 for connecting an external power source, and a second connector portion 92 for connecting an external device such as a computer which outputs an image signal. The first connector portion 91 and the second connector portion 92 are exposed in the −X-direction in the exterior housing 10. For example, the first connector portion 91 is provided in the central portion of the lower end portion of the sixth wall portion 16 in the rightward-leftward direction Y. For example, the second connector portion 92 is provided in a left side portion of the upper end portion of the sixth wall portion 16.

The exterior housing 10 has the lid portion 19 that forms a portion of the second wall portion 12. An outer shape of the lid portion 19 is a rectangular shape that is long in the forward-rearward direction X when viewed from below. The lid portion 19 has the first introduction port 80. In the present embodiment, the lid portion 19 includes a portion having the first introduction port 80 in the second wall portion 12, and a peripheral edge portion of the portion having the first introduction port 80 in the second wall portion 12. As illustrated in FIG. 7, in the present embodiment, the lid portion 19 includes a portion of a boundary portion between the second wall portion 12 and the fourth wall portion 14, and a portion of a lower side edge portion in the fourth wall portion 14.

The lid portion 19 has a support portion 19a protruding upward from an upper surface of the lid portion 19. The upper surface of the lid portion 19 is a portion of an inner surface of the exterior housing 10. The support portion 19a is located inside the exterior housing 10. Although not illustrated, the support portion 19a has a rectangular frame shape surrounding the first introduction port 80 when viewed in the upward-downward direction Z. A left side portion 19b of the support portion 19a protrudes upward of a right side portion 19c of the support portion 19a.

The lid portion 19 is attachable to and detachable from the exterior housing 10. When the lid portion 19 is detached, as indicated by an arrow in FIG. 7, a user of the projector 1 causes the lid portion 19 to pivot around a pivot axis R4 in the −Z-direction away from the first wall portion 11. In the present embodiment, the pivot axis R4 extends in the forward-rearward direction X orthogonal to the upward-downward direction Z. The pivot axis R4 is an imaginary axis that passes through the lower side end portion in the right side end portion of the lid portion 19. In a state where the projector 1 is installed at the installation surface G, the lid portion 19 is caused to pivot around the pivot axis R4. In this manner, as illustrated in FIG. 8, a portion of the lower surface of the lid portion 19 comes into contact with the installation surface G.

Next, the user slides the lid portion 19 in the +Y-direction as indicated by an arrow in FIG. 8. In this manner, the lid portion 19 is detached. In this way, in the present embodiment, the lid portion 19 is caused to pivot around the pivot axis R4 extending in the direction orthogonal to the upward-downward direction Z in the −Z-direction away from the first wall portion 11, and slides in the direction orthogonal to both the upward-downward direction Z and the pivot axis R4. In this manner, the lid portion 19 can be detached. On the other hand, when the lid portion 19 is attached again, the user slides the lid portion 19 from the +Y-direction to the −Y-direction, inserts the lid portion 19 between the exterior housing 10 and the installation surface G, and causes the lid portion 19 to pivot around the pivot axis R4 in the +Z-direction. In this manner, the lid portion 19 can be attached to the exterior housing 10 again.

Although not illustrated, the lid portion 19 has an engagement portion that engages with an engagement target portion provided inside the exterior housing 10. The engagement portion prevents the lid portion 19 from being unintentionally disengaged. In addition, the lid portion 19 has an operation portion which can disengage the engagement portion. The user can disengage the engagement portion by operating the operation portion. In this manner, the user enables the lid portion 19 to pivot around the pivot axis R4. The engagement portion is adapted to engage with the engagement target portion when the lid portion 19 is attached.

As illustrated in FIG. 3, the projector 1 further includes a power supply device (first cooling target) 20. The power supply device 20 supplies power supplied from an external power source connected to the projector 1 to each portion of the projector 1. The power supply device 20 is accommodated inside the exterior housing 10. For example, the power supply device 20 is disposed in a region in the −X-direction in an end portion in the +Y-direction inside the exterior housing 10. The power supply device 20 is located in a central region in the upward-downward direction Z inside the exterior housing 10. The power supply device 20 is covered by the fourth wall portion 14 from the left side. As illustrated in FIG. 5, the power supply device 20 is located at the upper side of the portion in the −X-direction of the first introduction port 80. The power supply device 20 has a case 21, a circuit board (first cooling target) 22, electronic components 23 and 24, and a heat sink 25.

The case 21 has a box shape for accommodating the circuit board 22, the electronic components 23 and 24, and the heat sink 25. The case 21 has a first opening portion 21a, a second opening portion 21b, and a third opening portion 21c. The first opening portion 21a is provided in the wall portion in the +X-direction among the wall portions that form the case 21. The first opening portion 21a is open in the +X-direction. The second opening portion 21b is provided in the wall portion in the −X-direction among the wall portions that form the case 21. The second opening portion 21b is open in the −X-direction. The second opening portion 21b is connected to the first opening portion 21a via the inside of the case 21.

For example, an opening area of the second opening portion 21b is larger than an opening area of the first opening portion 21a.

For example, the lower side end portion of the second opening portion 21b is located at the lower side of the lower side end portion of the first opening portion 21a. For example, the upper side end portion of the second opening portion 21b is located at the lower side of the upper side end portion of the first opening portion 21a, and is located at the upper side of the lower side end portion of the first opening portion 21a.

The third opening portion 21c is provided in the wall portion in the +Z-direction among the wall portions that form the case 21. More specifically, the third opening portion 21c is provided in the end portion in the −X-direction in the wall portion in the +Z-direction among the wall portions that form the case 21. The third opening portion 21c is open in the +Z-direction. The first opening portion 21a and the third opening portion 21c are connected to the second opening portion 21b via the inside of the case 21.

The circuit board 22 has a board shape whose plate surface faces the upward-downward direction Z. For example, the plate surface of the circuit board 22 is orthogonal to the upward-downward direction Z. Although not illustrated, the plate surface of the circuit board 22 has print wiring. The circuit board 22 is fixed to the wall portion in the +Z-direction among the wall portions that form the case 21. The circuit board 22 is disposed with a gap in the −Z-direction from the wall portion in the +Z-direction among the wall portions that form the case 21. For example, the circuit board 22 is located in the +Z-direction from the second opening portion 21b. For example, the circuit board 22 is located at a position in the upward-downward direction Z which is the same as that of the end portion in the +Z-direction of the first opening portion 21a.

The electronic components 23 and 24 are attached to the circuit board 22. The plurality of electronic components 23 and the electronic components 24 are respectively provided. The electronic component 23 is attached to the lower surface of the circuit board 22. For example, the electronic component 23 includes a component having a relatively large dimension in the upward-downward direction Z. For example, the electronic component 23 includes an electrolytic capacitor.

The electronic component 24 is attached to the upper surface of the circuit board 22. For example, the electronic component 24 includes a component whose dimension in the upward-downward direction Z is smaller than that of the electronic component 23. For example, the electronic component 24 includes a transistor. The heat sink 25 is attached to the lower surface of the circuit board 22. Heat generated in the electronic components 23 and 24 is transferred to the heat sink 25.

The projector 1 further includes a signal processor (first cooling target) 50. The signal processor 50 processes a signal input to the projector 1 from the outside, and transmits the signal to each portion of the projector 1. The signal processor 50 is accommodated inside the exterior housing 10.

In the present embodiment, the signal processor 50 is located in an end portion in the +Z-direction inside the exterior housing 10. For example, the signal processor 50 is located in the +Z-direction of the power supply device 20. The signal processor 50 is covered by the first wall portion 11 from above. The signal processor 50 is covered by the fourth wall portion 14 from the left side. The signal processor 50 has a circuit board (first cooling target) 51, an electronic component 52, a heat sink 53, and a heat conduction member 54.

The circuit board 51 has a board shape whose plate surface faces the upward-downward direction Z. For example, the plate surface of the circuit board 51 is orthogonal to the upward-downward direction Z. Although not illustrated, the plate surface of the circuit board 51 has print wiring. At least a portion of the circuit board 51 overlaps the circuit board 22 of the power supply device 20 when viewed in the upward-downward direction Z. In the present embodiment, only a portion of the circuit board 51 overlaps the circuit board 22 when viewed in the upward-downward direction Z. An end portion in the −X-direction of the circuit board 51 is located in the −X-direction, compared to an end portion in the −X-direction of the circuit board 22. The second connector portion 92 is electrically connected to the circuit board 51. In this manner, a signal transmitted from an external device connected to the second connector portion 92 is input to the signal processor 50 via the circuit board 51.

The electronic component 52 is attached to the upper surface of the circuit board 51. For example, the plurality of electronic components 52 are provided. The electronic component 52 includes a microcomputer that processes a signal input via the second connector portion 92, and a receiver that receives a wireless signal.

The heat sink 53 is attached to the lower surface of the circuit board 51 via the heat conduction member 54. The heat generated in the electronic component 52 is transferred to the heat sink 53 via the heat conduction member 54. For example, the heat conduction member 54 is a heat conduction sheet.

As illustrated in FIG. 3, the projector 1 further includes a rectifier (second cooling target) 60. The rectifier 60 rectifies a current supplied to the projector 1. More specifically, the rectifier 60 converts an alternating current supplied from an external power source connected to the first connector portion 91 into a direct current. In the present embodiment, the current rectified by the rectifier 60 is supplied to the power supply device 20. The rectifier 60 is accommodated inside the exterior housing 10. For example, the rectifier 60 is disposed in a region in the −Y-direction in an end portion in the −X-direction inside the exterior housing 10. The rectifier 60 is located in an end portion in the −Z-direction inside the exterior housing 10. The rectifier 60 is covered by the sixth wall portion 16 from the rear side. The rectifier 60 is covered by the second wall portion 12 from below.

As illustrated in FIG. 6, the rectifier 60 has a case 61, a circuit board 62, and an electronic component 63. The case 61 has a box shape for internally the circuit board 62 and the electronic component 63. The case 61 has a first opening portion 61a and a second opening portion 61b. The first opening portion 61a is provided in the wall portion in the +Y-direction among the wall portions that form the case 61. The first opening portion 61a is open in the +Y-direction.

The second opening portion 61b is provided in the wall portion in the −Y-direction among the wall portions that form the case 61. The second opening portion 61b is open in the −Y-direction. The second opening portion 61b is connected to the first opening portion 61a via the inside of the case 61. The second opening portion 61b is disposed away from the discharge port 81 in the +Y-direction. The end portion of the second opening portion 61b in the +Z-direction faces the rightward-leftward direction Y via a gap from the end portion of the discharge port 81 in the −Z-direction. The second opening portion 61b is connected to the discharge port 81 via the inside of the exterior housing 10.

The circuit board 62 has a board shape whose plate surface faces the upward-downward direction Z. For example, the plate surface of the circuit board 62 is orthogonal to the upward-downward direction Z. Although not illustrated, the plate surface of the circuit board 62 has print wiring. The electronic component 63 is attached to the upper surface of the circuit board 62.

For example, the plurality of electronic components 63 are provided. For example, the electronic component 63 includes a diode.

As illustrated in FIGS. 5 and 6, the projector 1 further includes a first fan 41, a second fan 42, a third fan 43, a first circulator 31, a second circulator 32, a third circulator 33, and a fourth circulator 34. The first fan 41, the second fan 42, the third fan 43, the first circulator 31, the second circulator 32, the third circulator 33, and the fourth circulator 34 are accommodated inside the exterior housing 10. A circulator can be defined as an air flow passage.

The first fan 41, the second fan 42, and the third fan 43 feed the air to the cooling targets respectively accommodated inside the exterior housing 10, and cool the cooling targets. In the present embodiment, the first fan 41, the second fan 42, and the third fan 43 are centrifugal fans. For example, the first fan 41, the second fan 42, and the third fan 43 are sirocco fans.

In the present embodiment, the first fan 41 feeds the air AR1 to the power supply device 20 and the signal processor 50. In the present embodiment, the second fan 42 feeds the air AR1 to the rectifier 60.

In the present embodiment, the third fan 43 feeds the air AR2 to the optical modulators 4RP, 4GP, and 4BP. That is, as the cooling targets, the projector 1 according to the present embodiment includes the power supply device 20, the signal processor 50, the rectifier 60, and the optical modulators 4RP, 4GP, and 4BP.

In addition, in the present embodiment, the cooling target includes the power supply device 20 and the signal processor 50 as the first cooling target, the rectifier 60 as the second cooling target, and the optical modulators 4RP, 4GP, and 4BP as the third cooling target.

As illustrated in FIG. 5, the first fan 41 is located in the +Z-direction of the front end portion of the first introduction port 80. The first fan 41 is located in a region in the +Z-direction inside the exterior housing 10. The first fan 41 is located in the +X-direction with respect to the power supply device 20 and the signal processor 50. That is, at least a portion of the first cooling target is located in the −X-direction with respect to the first fan 41. For example, the first fan 41 is disposed adjacent to the power supply device 20 in the +X-direction. The first fan 41 has a first suction port 41a and a first ejection port 41b.

The first suction port 41a is open in the −Z-direction. The first suction ports 41a are disposed at an interval in the +Z-direction of the front end portion of the first introduction port 80. The first suction port 41a suctions the air AR1 introduced into the exterior housing 10 from the first introduction port 80. The first ejection port 41b ejects the air AR1 suctioned from the first suction port 41a. The first ejection port 41b is open in the −X-direction. The air AR1 ejected from the first ejection port 41b is fed to the power supply device 20, and is fed to the signal processor 50 via the third circulator 33 (to be described later). In the present embodiment, the first ejection port 41b faces the power supply device 20 in the forward-rearward direction X. For example, the first ejection port 41b is connected to the first opening portion 21a in the case 21 of the power supply device 20. Although not illustrated, the first fan 41 has internally rotating blades. For example, the first fan 41 is disposed inside the exterior housing 10 so that the rotation axis R1 of the first fan 41 extends in the upward-downward direction Z.

The second fan 42 is disposed along the forward-rearward direction X at a position where the power supply device 20 is interposed between the first fan 41 and the second fan 42. That is, in the present embodiment, at least a portion of the power supply device 20 serving as the first cooling target is located between the first fan 41 and the second fan 42. For example, the second fan 42 is disposed adjacent to the power supply device 20 in the −X-direction. The second fan 42 is located in a central region in the upward-downward direction Z inside the exterior housing 10. The second fan 42 is located in the −Z-direction of the second connector portion 92. As illustrated in FIG. 6, the rectifier 60 is located between the second fan 42 and the third wall portion 13 in the rightward-leftward direction Y. That is, the rectifier 60 is disposed along the rightward-leftward direction Y between the second fan 42 and the third wall portion 13. The second fan 42 has a second suction port 42a and a second ejection port 42b.

The second suction port 42a is open in the +X-direction. The second suction port 42a suctions the air AR1 ejected from the first ejection port 41b of the first fan 41. The second suction port 42a is connected to the second opening portion 21b in the case 21 of the power supply device 20. The second ejection port 42b ejects the air AR1 suctioned from the second suction port 42a. The second ejection port 42b is open in the −Y-direction, as illustrated in FIG. 6. The air AR1 ejected from the second ejection port 42b is fed to the rectifier 60 via the second circulator 32 (to be described later). In the present embodiment, the second ejection port 42b is open obliquely rightward and downward. Although not illustrated, the second fan 42 has internally rotating blades. For example, the second fan 42 is disposed inside the exterior housing 10 so that the rotation axis R2 of the second fan 42 extends in the forward-rearward direction X. That is, in the present embodiment, an extending direction of the rotation axis R1 of the first fan 41 and an extending direction of the rotation axis R2 of the second fan 42 are orthogonal to each other.

In the present specification, description of "certain objects are orthogonal to each other" means a case where certain objects are strictly orthogonal to each other and a case where certain objects are substantially orthogonal to each other. That is, in the present embodiment, the extending direction of the rotation axis R1 of the first fan 41 and the extending direction of the rotation axis R2 of the second fan 42 may be strictly orthogonal to each other, or may be substantially orthogonal to each other. In the present specification, for example, description of "certain objects are substantially orthogonal to each other" includes a case where an angle of one object with respect to the other object is approximately within ±15° with reference to 90°.

As illustrated in FIG. 5, the third fan 43 is located in the central region in the upward-downward direction Z inside the exterior housing 10. The third fan 43 is located in the −Y-direction with respect to the first fan 41 and the second fan 42. A portion of the third fan 43 overlaps the first fan 41 when viewed in the rightward-leftward direction Y. As illustrated in FIG. 7, the third fan 43 is located in the −Y-direction from the power supply device 20.

The third fan 43 has a third suction port 43a and a third ejection port 43b.

As illustrated in FIG. 5, the third suction port 43a suctions the air AR2 introduced into the exterior housing 10 from the first introduction port 80. The third suction port 43a is open in the +Y-direction. The third ejection port 43b illustrated in FIG. 7 ejects the air AR2 suctioned from the third suction port 43a. The third ejection port 43b is open in the −X-direction. The air AR2 ejected from the third ejection port 43b is fed to the optical modulators 4RP, 4GP, and 4BP via a duct (not illustrated), for example. Although not illustrated, the third fan 43 has internally rotating blades. For example, the third fan 43 is disposed inside the exterior housing 10 so that the rotation axis R3 of the third fan 43 extends in the rightward-leftward direction Y. In the present embodiment, the extending direction of the rotation axis R1 of the first fan 41, the extending direction of the rotation axis R2 of the second fan 42, and the extending direction of the rotation axis R3 of the third fan 43 are orthogonal to each other.

As illustrated in FIG. 5, the first circulator 31 is located along the upward-downward direction Z between the second wall portion 12 and the first fan 41, inside the exterior housing 10. In the present embodiment, the first circulator 31 is a duct linearly extending in the upward-downward direction Z, and is not bent. The first circulator 31 is open at both sides in the upward-downward direction Z. An opening portion of the first circulator 31 in the −Z-direction is an inlet 31a. At least a portion of the inlet 31a overlaps the first introduction port 80 when viewed in the upward-downward direction Z. An opening portion of the first circulator 31 in the +Z-direction is an outlet 31b. The outlet 31b is connected to the first suction port 41a of the first fan 41.

The air AR1 suctioned by the first fan 41 circulates inside the first circulator 31. The air AR1 introduced into the exterior housing 10 from the first introduction port 80 flows into the first circulator 31 from the inlet 31a. The air AR1 flowing into the first circulator 31 flows out from the outlet 31b to the first suction port 41a of the first fan 41. In this way, the first circulator 31 extends in the upward-downward direction Z, and guides the air AR1 introduced from the first introduction port 80 into the exterior housing 10 to the first suction port 41a.

As illustrated in FIG. 6, the second circulator 32 is located along the rightward-leftward direction Y between the second fan 42 and the rectifier 60 inside the exterior housing 10. In the present embodiment, the second circulator 32 is a duct extending in the rightward-leftward direction Y. A portion of the second circulator 32 in the −Y-direction extends to be inclined obliquely downward. The second circulator 32 is open at both sides in the rightward-leftward direction Y. An opening portion of the second circulator 32 in the +Y-direction is an inlet 32a. The inlet 32a is connected to the second ejection port 42b of the second fan 42. An opening portion of the second circulator 32 in the −Y-direction is an outlet 32b. The outlet 32b is connected to the first opening portion 61a of the case 61 in the rectifier 60. For example, the outlet 32b is open obliquely rightward and downward.

The air AR1 ejected from the second fan 42 circulates inside the second circulator 32. The air AR1 ejected from the second ejection port 42b flows into the second circulator 32 from the inlet 32a. The air AR1 flowing into the second circulator 32 flows out from the outlet 32b to the first opening portion 61a of the case 61 in the rectifier 60. In this way, the second circulator 32 guides the air AR1 ejected from the second ejection port 42b to the rectifier 60.

As illustrated in FIG. 5, the third circulator 33 is located in the +Z-direction of the power supply device 20 inside the exterior housing 10. In the present embodiment, the third circulator 33 is configured to include a wall portion in the +Z-direction of the case 21 in the power supply device 20 and a duct member disposed in the wall portion in the +Z-direction of the case 21. That is, a portion of the wall portion of the third circulator 33 is configured to include the wall portion in the +Z-direction of the case 21. The third circulator 33 extends in the forward-rearward direction X. The third circulator 33 is open at both sides in the forward-rearward direction X. An opening portion of the third circulator 33 in the +X-direction is an inlet 33a which is open in the +X-direction. The inlet 33a is located in the +Z-direction of the first opening portion 21a of the case 21. The inlet 33a is connected to the first ejection port 41b of the first fan 41. An opening portion of the third circulator 33 in the −X-direction is an outlet 33b which is open obliquely rearward and upward. The outlets 33b are disposed to face each other with a gap in the −Z-direction at the front end portion of the circuit board 51 in the signal processor 50.

The air AR1 ejected from the first fan 41 circulates inside the third circulator 33. The air AR1 ejected from the first ejection port 41b flows into the third circulator 33 from the inlet 33a. The air AR1 flowing into the third circulator 33 flows out from the outlet 33b toward a surface of the circuit board 51 in the −Z-direction. In this way, the third circulator 33 guides the air AR1 ejected from the first ejection port 41b to the signal processor 50.

As illustrated in FIGS. 5 and 7, the fourth circulator 34 is located across a region of the power supply device 20 in the −Z-direction and a region of the power supply device 20 in the −Y-direction, inside the exterior housing 10. In the present embodiment, the fourth circulator 34 is a duct. As illustrated in FIG. 7, the fourth circulator 34 has an inlet 34a which is open in the −Z-direction and an outlet 34b which is open in the −Y-direction. The inlet 34a is located in the +Z-direction of the first introduction port 80. The outlet 34b is located in the +Z-direction and the −Y-direction with respect to the inlet 34a. The outlet 34b is connected to the third suction port 43a of the third fan 43.

The air AR2 suctioned by the third fan 43 circulates inside the fourth circulator 34. The air AR2 introduced into the exterior housing 10 from the first introduction port 80 flows into the fourth circulator 34 from the inlet 34a. The air AR2 flowing into the fourth circulator 34 flows out from the outlet 34b to the third suction port 43a of the third fan 43. In this way, the fourth circulator 34 guides the air AR2 introduced into the exterior housing 10 from the first introduction port 80 to the third suction port 43a.

As illustrated in FIG. 5, the projector 1 further includes an air filter 70 through which the air introduced into the exterior housing 10 from the first introduction port 80 passes. The air filter 70 is disposed to face the first introduction port 80 along the upward-downward direction Z, inside the exterior housing 10. In the present embodiment, the air filter 70 is attached to the lid portion 19. The air filter 70 has a frame portion 70a and a main body portion 73.

The frame portion 70a has a frame portion main body 71 and a partition wall portion 72. The frame portion main body 71 has a rectangular frame shape. As illustrated in FIG. 7, the frame portion main body 71 is supported from below by the second wall portion 12. More specifically, the frame portion main body 71 is supported from below by the support portion 19a of the lid portion 19.

Here, as described above, the left side portion 19b of the support portion 19a further protrudes in the +Z-direction, compared to the right side portion 19c of the support portion 19a. Therefore, the frame portion main body 71 supported by the support portion 19a in the −Z-direction is obliquely disposed to be located in the +Z-direction as the frame portion main body 71 faces the +Y-direction. In this manner, inside the exterior housing 10, the air filter 70 is disposed to be inclined in a direction in which the lid portion 19 is slid when the lid portion 19 is detached, that is, in a direction closer to the first wall portion 11 as the air filter 70 faces the +Y-direction. In the present embodiment, as illustrated in FIG. 8, in a state where the lid portion 19 is caused to pivot around the pivot axis R4 until the lid portion 19 comes into contact with the installation surface G, the air filter 70 adopts a posture along a plane orthogonal to the upward-downward direction Z.

An elastic member 75 is disposed between the frame portion main body 71 and the support portion 19a. The elastic member 75 has a rectangular frame shape formed along a shape of the frame portion main body 71. The elastic member 75 applies an elastic force to the frame portion main body 71 in the +Z-direction in which the frame portion main body 71 is away from the support portion 19a. In the present embodiment, the elastic member 75 applies the elastic force to the frame portion main body 71 obliquely upward and rightward. For example, the elastic member 75 is made of rubber. The elastic member 75 seals a portion between the frame portion main body 71 and the support portion 19a.

The partition wall portion 72 extends from a portion of the frame portion main body 71 in the +Y-direction to a portion of the frame portion main body 71 in the −Y-direction. As illustrated in FIG. 5, the partition wall portion 72 partitions an inner side of the frame portion main body 71 in the forward-rearward direction X. In this manner, the frame portion 70a has a shape in which two rectangular frame-shaped portions are connected to each other in the forward-rearward direction X. An end portion of the frame portion 70a in the +Z-direction is in contact with a peripheral edge portion of the inlet 31a in the first circulator 31 and a peripheral edge portion of the inlet 34a in the fourth circulator 34 via a sealing member 74.

The sealing member 74 seals a portion between peripheral edge portions of the inlets 31a and 34a and an end portion of the frame portion 70a in the +Z-direction. The sealing member 74 has a rectangular frame shape formed along a shape of the frame portion 70a. For example, the sealing member 74 is made of rubber. The sealing member 74 is fixed to a peripheral edge portion of the inlet 31a in the first circulator 31 and a peripheral edge portion of the inlet 34a in the fourth circulator 34. In the present embodiment, the frame portion main body 71 receives the elastic force in the +Z-direction by the elastic member 75. Accordingly, the frame portion 70a is pressed against the sealing member 74 in the −Z-direction. In this manner, the frame portion 70a and the sealing member 74 are brought into a state of being in suitably close contact with each other, and sealing performance of the sealing member 74 can be suitably obtained. The partition wall portion 72 is in indirect contact with the peripheral edge portion of the inlet 31a in the first circulator 31 via the sealing member 74.

As illustrated in FIG. 8, in a state where the lid portion 19 is caused to pivot around the pivot axis R4 until the lid portion 19 comes into contact with the installation surface G, the air filter 70 is brought into a state of being away from the sealing member 74 in the −Z-direction. In this manner, it is possible to prevent the sealing member 74 from being resistance when the lid portion 19 is slid and pulled out.

As illustrated in FIG. 5, the main body portion 73 is provided in an entire body inside the frame portion 70a. An outer peripheral edge portion of the main body portion 73 is connected to an inner peripheral edge portion of the frame portion 70a. For example, the main body portion 73 has a shape having a plurality of folds. For example, the main body portion 73 is a dry filter. The main body portion 73 may be a wet filter. The main body portion 73 has a first filter portion 73a and a second filter portion 73b.

The first filter portion 73a is provided in a portion partitioned by the partition wall portion 72 in the +X-direction, inside the frame portion 70a. The second filter portion 73b is provided in a portion partitioned by the partition wall portion 72 in the −X-direction, inside the frame portion 70a. That is, the partition wall portion 72 partitions the first filter portion 73a and the second filter portion 73b.

The first filter portion 73a is a portion of the main body portion 73, which faces the inlet 31a of the first circulator 31. The air AR1 flowing into the first circulator 31 passes through the first filter portion 73a. That is, the air AR1 flows into the first circulator 31 after passing through the air filter 70. The second filter portion 73b is a portion of the main body portion 73, which faces the inlet 34a of the fourth circulator 34. The second filter portion 73b is located in the −X-direction with respect to the first filter portion 73a. The air AR2 suctioned by the third suction port 43a of the third fan 43 passes through the second filter portion 73b. That is, the air AR2 is suctioned by the third suction port 43a after passing through the air filter 70. A dimension of the second filter portion 73b along the forward-rearward direction X is larger than a dimension of the first filter portion 73a along the forward-rearward direction X.

The projector 1 further includes a partition member 100. The partition member 100 partitions a space between the first introduction port 80 and the air filter 70 into a first space S1 and a second space S2. The first space S1 is connected to the first suction port 41a of the first fan 41 via the first filter portion 73a. The second space S2 is connected to the third suction port 43a of the third fan 43 via the second filter portion 73b. The second space S2 is located in the −X-direction with respect to the first space S1. For example, a volume of the second space S2 is larger than a volume of the first space S1. The partition member 100 is connected to the partition wall portion 72. More specifically, an end portion of the partition member 100 in the +Z-direction is connected to an end portion of the partition wall portion 72 in the −Z-direction. In the present embodiment, the end portion of the partition member 100 in the +Z-direction is in contact with the end portion of the partition wall portion 72 in the −Z-direction by being pressed in the −Z-direction. The end portion of the partition member 100 in the −Z-direction is fixed to the surface of the lid portion 19 in the +Z-direction. For example, the partition member 100 has a board shape whose plate surface faces the forward-rearward direction X.

Next, a flow of the air inside the projector 1 will be described in detail. The first fan 41 and the third fan 43 are driven so that the air present outside the exterior housing 10 is introduced into the exterior housing 10 from the first introduction port 80. In the present embodiment, the air present between the installation surface G and the second wall portion 12 is introduced into the exterior housing 10 from the first introduction port 80. In the air introduced into the exterior housing 10, the air AR1 introduced into the first space S1 flows into the first circulator 31 via the first filter portion 73a, flows into the first circulator 31, flows in the +Z-direction inside the first circulator 31, and is suctioned by the first suction port 41a of the first fan 41. The air AR1 suctioned by the first fan 41 is ejected from the first ejection port 41b in the −X-direction. The air AR1 ejected from the first ejection port 41b is divided into air AR1a flowing into the case 21 of the power supply device 20 from the first opening portion 21a, and air AR1b flowing into the third circulator 33 from the inlet 33a.

The air AR1a flowing into the case 21 is blown to the electronic component 23 and the heat sink 25 of the power supply device 20. In this manner, the heat can be taken away from the electronic component 23 and the heat sink 25 by the air AR1a. Therefore, the power supply device 20 can be cooled.

The air AR1a passing through the electronic component 23 and the heat sink 25 is suctioned by the second suction port 42a of the second fan 42 via the second opening portion 21b.

On the other hand, the air AR1b flowing into the third circulator 33 flows in the −X-direction inside the third circulator 33, and is ejected obliquely rearward and upward from the outlet 33b. The air AR1b ejected from the third circulator 33 is blown to the circuit board 51 and the heat sink 53 of the signal processor 50. In this manner, the heat can be taken away from the circuit board 51 and the heat sink 53 by the air AR1b. Therefore, the signal processor 50 can be cooled. The air AR1b blown to the circuit board 51 and the heat sink 53 flows in the −X-direction along a surface of the circuit board 51 in the −Z-direction or a surface of the heat sink 53 in the −Z-direction. The air AR1b passing through the circuit board 51 and the heat sink 53 flows into the case 21 via the third opening portion 21c in the case 21 of the power supply device 20. The air AR1b flowing into the case 21 merges with the air AR1a, and is suctioned by the second suction port 42a of the second fan 42 from the second opening portion 21b. As described above, in the present embodiment, the air AR1 ejected from the first ejection port 41b of the first fan 41 is divided and fed to each of the power supply device 20 and the signal processor 50.

The air AR1 suctioned by the second fan 42 from the second suction port 42a is ejected in the −Y-direction from the second ejection port 42b as illustrated in FIG. 6. The air AR1 ejected from the second ejection port 42b flows into the second circulator 32 from the inlet 32a. The air AR1 flowing into the second circulator 32 flows in the −Y-direction inside the second circulator 32, and flows into the case 61 in the rectifier 60 from the first opening portion 61a.

The air AR1 flowing into the case 61 is blown to the circuit board 62 and the electronic component 63 of the rectifier 60. In this manner, the heat can be taken away from the circuit board 62 and the electronic component 63 by the air AR1. Therefore, the rectifier 60 can be cooled. The air AR1 passing through the circuit board 62 and the electronic component 63 is discharged from the inside of the case 61 via the second opening portion 61b. The air AR1 discharged from the inside of the case 61 flows in the −Y-direction inside the exterior housing 10, and is discharged outward of the exterior housing 10 from the discharge port 81. In this manner, the heat taken away from each of the cooling targets by the air AR1 can be released outward of the exterior housing 10.

On the other hand, as illustrated in FIG. 5, in the air introduced into the exterior housing 10, the air AR2 introduced into the second space S2 flows into the fourth circulator 34 via the second filter portion 73b, and is suctioned by the third suction port 43a of the third fan 43. Although not illustrated, the air AR2 suctioned by the third fan 43 is ejected from the third ejection port 43b, and is fed to the optical modulators 4RP, 4GP, and 4BP. In this manner, the optical modulators 4RP, 4GP, and 4BP can be cooled by the air AR2. After cooling the optical modulators 4RP, 4GP, and 4BP, the air AR2 is discharged outward of the exterior housing 10 from the discharge port 81, for example. In this manner, the heat taken away from the optical modulators 4RP, 4GP, and 4BP by the air AR2 can be released outward of the exterior housing 10.

In addition, a fan (not illustrated) accommodated inside the exterior housing 10 is driven so that the air present outside the exterior housing 10 is introduced into the exterior housing 10 from the second introduction port 82. The air introduced into the exterior housing 10 from the second introduction port 82 is suctioned by a fan (not illustrated), for example, and is fed to the heat sink attached to the light source 2. In this manner, the light source 2 is cooled. Unlike the first introduction port 80, the air filter is not provided for the second introduction port 82. That is, the air introduced into the exterior housing 10 from the second introduction port 82 is fed to the heat sink attached to the light source 2 without passing through the air filter. Even in this case, the air is fed to the heat sink without directly feeding the air to the light source 2. Accordingly, it is possible to prevent dust from adhering to the light source 2. As in the first introduction port 80, the air filter may be provided for the second introduction port 82.

For example, the cooling targets included in the projector 1 such as the power supply device 20 and the signal processor 50 are likely to be disposed at an upward position away from the second wall portion 12 inside the exterior housing 10. Therefore, for example, when the air is introduced into the exterior housing 10 from the first introduction port 80 provided in the second wall portion 12, if the fan is provided in the second wall portion 12, a path through which the air ejected from the ejection port of the fan reaches the cooling target is lengthened. Consequently, there is a possibility that the cooling target may not be suitably cooled.

In contrast, according to the present embodiment, the first circulator 31 is located along the upward-downward direction Z between the second wall portion 12 and the first fan 41 inside the exterior housing 10. The first circulator 31 extends in the upward-downward direction Z, and guides the air AR1 introduced into the exterior housing 10 from the first introduction port 80 to the first suction port 41a. Therefore, even when the first fan 41 is disposed away from the second wall portion 12 in the +Z-direction, the air AR1 can be suitably guided to the first fan 41 by the first circulator 31.

In this manner, while the position of the first fan 41 in the upward-downward direction Z is moved closer to the position in the upward-downward direction Z of the first cooling target which is likely to be disposed away from the second wall portion 12 in the +Z-direction, the air AR1 can be suitably suctioned by the first fan 41. In addition, at least a portion of the first cooling target is located in the −X-direction with respect to the first fan 41, and the first ejection port 41b is open in the −X-direction. That is, the first ejection port 41b of the first fan 41 is open to a side the same as a side where at least a portion of the first cooling target is disposed with respect to the first fan 41. Therefore, the air AR1 ejected from the first ejection port 41b is easily fed to the first cooling target. For these reasons, the path through which the air AR1 ejected from the first ejection port 41b of the first fan 41 reaches the first cooling target can be shortened. Therefore, the first cooling target can be suitably cooled by the air AR1 fed from the first fan 41. That is, in the present embodiment, the power supply device 20 and the signal processor 50 which are the first cooling targets can be suitably cooled.

When the projector 1 is used while being stationary at the installation surface G as in the present embodiment, the second wall portion 12 serves as a bottom wall portion. In this case, the air AR1 suctioned by the first fan 41 is introduced into the exterior housing 10 via the first introduction port 80 from a portion between the second wall portion 12 and the installation surface G. Therefore, for example, even when the plurality of projectors 1 are disposed adjacent to each other in the rightward-leftward direction Y, the air having a relatively high temperature which is discharged from the discharge port 81 of one projector 1 is less likely to be introduced into the exterior housing 10 of the other projector 1. In this manner, the air having a relatively low temperature is likely to be introduced into the exterior housing 10. Therefore, the first cooling target is likely to be more suitably cooled by the first fan 41.

In addition, when the projector 1 is used while being stationary at the installation surface G as in the present embodiment, the outer surface of the second wall portion 12 faces downward. Accordingly, unlike a case where the projector 1 is suspended from a ceiling, dust is less likely to be accumulated at the outer surface of the second wall portion 12. In this manner, it is possible to adopt a configuration in which the dust is less likely to be mixed into the air introduced into the exterior housing 10 from the first introduction port 80 provided in the second wall portion 12.

In addition, according to the present embodiment, the plurality of first cooling targets such as the power supply device 20 and the signal processor 50 are provided, and the air AR1 ejected from the first ejection port 41b of the first fan 41 is divided and fed to each of the plurality of first cooling targets. Therefore, each of the plurality of first cooling targets can be suitably cooled. In the present embodiment, each of the power supply device 20 and the signal processor 50 can be suitably cooled.

In addition, according to the present embodiment, the first cooling target includes the power supply device 20. The power supply device 20 is likely to have a relatively large amount of heat generation. Therefore, the power supply device 20 can be suitably cooled by the first fan 41. Accordingly, cooling efficiency of the overall projector 1 can be improved.

In addition, according to the present embodiment, the light guide system 3 is located between the light source 2 and the power supply device 20. Therefore, for example, the projector 1 can be downsized in the upward-downward direction Z, compared to a case where the power supply device 20 is disposed in the −Z-direction with respect to the light guide system 3. In this manner, the projector 1 can be easily downsized in the upward-downward direction Z. In addition, the light guide system 3 can be disposed in the central portion of the projector 1 in the rightward-leftward direction Y. Accordingly, the projection optical device 6 to which the light is guided by the light guide system 3 can also be disposed in the central portion of the projector 1 in the rightward-leftward direction Y. Therefore, the projection port 17 through which the light reflected by the reflection member 6b passes can be disposed in the central portion of the projector 1 in the rightward-leftward direction Y. In this manner, a color image (picture) can be projected on the screen SCR from the central portion of the projector 1 in the rightward-leftward direction Y. Therefore, when a user adjusts a position of the projector 1, the user easily adjusts the position of the projector 1 in the rightward-leftward direction Y with respect to the screen SCR.

Therefore, convenience for the user can be improved.

In addition, according to the present embodiment, the first cooling target includes the circuit boards 22 and 51. The electronic components 23 and 24 are attached to the circuit board 22, and the electronic component 52 is attached to the circuit board 51. Accordingly, the amount of heat generation is likely to relatively increase. Therefore, the circuit boards 22 and 51 can be suitably cooled by the first fan 41. In this manner, the cooling efficiency of the overall projector 1 can be improved.

In addition, according to the present embodiment, the second fan 42 is provided, and the air AR1 ejected from the second ejection port 42b of the second fan 42 is fed to the rectifier 60 which is the second cooling target. Therefore, the rectifier 60 can be cooled by the second fan 42. In addition, the second fan 42 has the second suction port 42a for suctioning the air AR 1 ejected from the first ejection port 41b of the first fan 41, and at least a portion of the power supply device 20 which is the first cooling target is located between the first fan 41 and the second fan 42. Therefore, the air AR1 ejected from the first ejection port 41b of the first fan 41 and cooling the first cooling target is easily suctioned by the second suction port 42a of the second fan 42. In this manner, the air AR1 ejected from the first fan 41 is easily fed to the second cooling target by the second fan 42. Therefore, the first cooling target and the second cooling target can be sequentially and efficiently cooled.

In addition, according to the present embodiment, the rectifier 60 which is the second cooling target is disposed along the rightward-leftward direction Y between the second fan 42 and the third wall portion 13. Therefore, the air AR1 ejected from the second ejection port 42b and fed to the second cooling target is easily fed to the discharge port 81 provided in the third wall portion 13. In this manner, the air AR1 taking the heat away from each cooling target can be suitably discharged outward of the exterior housing 10. Therefore, the heat generated inside the projector 1 can be suitably released outward of the projector 1.

In addition, the air AR1 can be fed from the second fan 42 to the second cooling target in a direction intersecting with the flowing direction of the air AR1 fed from the first fan 41 to the first cooling target. Therefore, inside the exterior housing 10, the air AR1 can suitably and easily flow along each inner surface of the two wall portions among the wall portions that form the exterior housing 10. Specifically, in the present embodiment, as illustrated in FIG. 3, the air AR1 fed from the first fan 41 flows in the −X-direction along the inner surface of the fourth wall portion 14, and the air AR1 fed from the second fan 42 flows in the −Y-direction along the inner surface of the sixth wall portion 16. That is, in the present embodiment, the air AR1 flows in an approximately L-shape along the outer peripheral edge portion inside the exterior housing 10. In this manner, it is easy to efficiently secure a flowing path of the air AR1 inside the exterior housing 10. Therefore, the plurality of cooling targets can be suitably cooled by the air AR1 flowing from the first introduction port 80 to the discharge port 81 through the inside of the exterior housing 10.

In addition, according to the present embodiment, the extending direction of the rotation axis R1 of the first fan 41 and the extending direction of the rotation axis R2 of the second fan 42 are orthogonal to each other. Therefore, when the first fan 41 and the second fan 42 are centrifugal fans, in a state where the first ejection port 41b of the first fan 41 and the second suction port 42a of the second fan 42 are open while facing each other, it is easy to dispose the first fan 41 and the second fan 42. That is, in the present embodiment, in a state where the first ejection port 41b is open in the −X-direction and the second suction port 42a is open in the +X-direction, it is easy to dispose the first fan 41 and the second fan 42. In this manner, the air AR1 ejected from the first ejection port 41b is easily suctioned by the second suction port 42a. Therefore, a loss is less likely to occur in the air AR1 flowing from the first fan 41 to the second fan 42, and thus, blowing efficiency of each fan can be improved.

In addition, according to the present embodiment, there is provided the second circulator 32 for guiding the air AR1 ejected from the second ejection port 42b of the second fan 42 to the rectifier 60 which is the second cooling target. Therefore, the air AR1 can be suitably fed to the rectifier 60. In this manner, the rectifier 60 which is the second cooling target can be suitably cooled.

In addition, according to the present embodiment, the second cooling target includes the rectifier 60 which rectifies the current supplied to the projector 1. The rectifier 60 is likely to have a relatively large amount of heat generation. Therefore, the rectifier 60 can be suitably cooled by the second fan 42. In this manner, the cooling efficiency of the entire projector 1 can be further improved.

In addition, according to the present embodiment, there is provided the air filter 70 through which the air introduced into the exterior housing 10 from the first introduction port 80 passes. The air AR1 passing through the air filter 70 flows into the first circulator 31. Therefore, even when a foreign matter such as dust is mixed into the air present outside the exterior housing 10, the foreign matter can be removed by the air filter 70. In this manner, it is possible to prevent the foreign matter from being mixed into the air AR1 fed from the first circulator 31 to the power supply device 20 and the signal processor 50 which are the first cooling targets. Therefore, it is possible to prevent the foreign matter from adhering to the power supply device 20 and the signal processor 50.

In addition, according to the present embodiment, there is provided the third fan 43 having the third suction port 43a for suctioning the air AR2 introduced into the exterior housing 10 from the first introduction port 80 and the third ejection port 43b for ejecting the air AR2 suctioned from the third suction port 43a. The air AR2 ejected from the third ejection port 43b is fed to the optical modulators 4RP, 4GP, and 4BP. Therefore, the optical modulators 4RP, 4GP, and 4BP can be cooled by using a portion of the air introduced from the first introduction port 80. In addition, the third fan 43 can suction the air from the introduction port the same as the first introduction port 80 into which the air AR1 suctioned by the first fan 41 is introduced. Accordingly, the number of the introduction ports provided in the exterior housing 10 can be reduced.

In addition, the air AR2 passing through the air filter 70 is suctioned by the third suction port 43a. Therefore, it is possible to prevent the foreign matter from being mixed into the air AR2 fed to the optical modulators 4RP, 4GP, and 4BP. Therefore, it is possible to prevent the foreign matter from adhering to the optical modulators 4RP, 4GP, and 4BP.

In addition, according to the present embodiment, the air filter 70 has the first filter portion 73a through which the air AR1 flowing into the first circulator 31 passes, the second filter portion 73b through which the air AR2 suctioned by the third suction port 43a of the third fan 43, and the partition wall portion 72 which partitions the first filter portion 73a and the second filter portion 73b. There is provided the partition member 100 that partitions the space between the first introduction port 80 and the air filter 70 into the first space S1 connected to the first suction port 41a of the first fan 41 via the first filter portion 73a, and the second space S2 connected to the third suction port 43a of the third fan 43 via the second filter portion 73b. Therefore, the air introduced into the exterior housing 10 from the first introduction port 80 is introduced by being divided into the air AR1 flowing into the first space S1 and the air AR2 flowing into the second space S2. In addition, the partition member 100 is connected to the partition wall portion 72. Therefore, the air divided and introduced into the first space S1 and the second space S2 passes through each of the first filter portion 73a and the second filter portion 73b which are partitioned by the partition wall portion 72, and is suctioned by the suction port of each fan. In this manner, even in a case of a different output from each fan, the air can be suitably suctioned by each fan.

Specifically, for example, when the output of the third fan 43 is larger than the output of the first fan 41, and when the partition member 100 and the partition wall portion 72 are not provided, there is a possibility that a portion of the air introduced into the exterior housing 10 from a portion overlapping the first circulator 31 in the upward-downward direction Z in the first introduction port 80 may flow into the fourth circulator 34 due to a suction force of the third fan 43. Therefore, the amount of the air AR1 suctioned by the first fan 41 decreases, thereby causing a possibility that the amount of the air AR1 fed to the first cooling target and the second cooling target may decrease. In contrast, the partition member 100 is provided, thereby preventing the air AR1 flowing into the first space S1 from flowing into the second space S2. In addition, the partition wall portion 72 connected to the partition member 100 is provided. In this manner, it is possible to prevent the air AR1 flowing into the first space S1 from passing through the second filter portion 73b. Therefore, it is possible to prevent the amount of the air AR1 suctioned from the first space S1 by the first fan 41 from decreasing. In this manner, it is possible to prevent the amount of the air AR1 fed to the first cooling target and the second cooling target from decreasing.

In addition, according to the present embodiment, the exterior housing 10 has the lid portion 19 which has the first introduction port 80 and which is attachable to and detachable from the exterior housing 10. The air filter 70 is attached to the lid portion 19. Therefore, the air filter 70 can be detached by detaching the lid portion 19. In this manner, the air filter 70 can be easily replaced.

In addition, according to the present embodiment, the lid portion 19 pivots in the −Z-direction away from the first wall portion 11 around the pivot axis R4 extending in the direction orthogonal to the upward-downward direction Z, and can be detached by sliding in the direction orthogonal to both the upward-downward direction Z and the pivot axis R4. Therefore, when the projector 1 is used while being stationary at the installation surface G as in the present embodiment, the lid portion 19 can be detached by sliding the lid portion 19 in the direction orthogonal to the upward-downward direction Z from a portion between the second wall portion 12 and the installation surface G. In this manner, for example, the air filter 70 can be detached together with the lid portion 19 without moving the position of the projector 1 such as reversing the projector 1. Therefore, the convenience for the user can be improved.

In addition, according to the present embodiment, inside the exterior housing 10, the air filter 70 is disposed to be inclined in the +Z-direction closer to the first wall portion 11 as the lid portion 19 faces the +Y-direction in which the lid portion 19 is slid when the lid portion 19 is detached. Therefore, when the lid portion 19 is detached, if the lid portion 19 is caused to pivot in the −Z-direction around the pivot axis R4, the air filter 70 is likely to adopt a posture along a plane orthogonal to the upward-downward direction Z. In this manner, it is easy to replace the air filter 70 when the lid portion 19 is slid and pulled out. In addition, compared to a case where the air filter 70 adopts the posture along the plane orthogonal to the upward-downward direction Z in a state where the lid portion 19 is attached, a position of the portion of the air filter 70 in the −Y-direction is easily lowered in the −Z-direction. In this manner, it is easy to secure a large flow path for the air AR1 and AR2 flowing in the +Z-direction in the portion in the −Y-direction of the air filter 70 in a state where the lid portion 19 is attached. In addition, compared to a case where the air filter 70 adopts the posture along the plane orthogonal to the upward-downward direction Z in a state where the lid portion 19 is attached, a position of the portion of the air filter 70 in the +Y-direction is easily raised in the +Z-direction. In this manner, the position of the portion of the lid portion 19 in the +Y-direction is easily raised in the +Z-direction. Therefore, in a state where the projector 1 is installed at the installation surface G, it is easy to secure a large angle at which the lid portion 19 can pivot.

Without being limited to the above-described embodiments, the embodiments according to the present disclosure can adopt the following configurations.

The first circulator, the second circulator, the third circulator, and the fourth circulator are not particularly limited as long as the air can circulate in each circulator without providing a duct. The first circulator, the second circulator, the third circulator, and the fourth circulator may be configured to include a hole provided in the wall portion of the exterior housing, for example.

A type of the first fan, a type of the second fan, and a type of the third fan are not particularly limited. The first fan, the second fan, and the third fan may be axial fans. The type of the first fan, the type of the second fan, and the type of the third fan may be different from each other. The disposition and the posture of the respective fans are not particularly limited. For example, the extending direction of the rotation axis of the first fan and the extending direction of the rotation axis of the second fan may be parallel to each other. The second fan may not be provided. The third fan may not be provided.

A type and a structure of the air filter are not particularly limited. The air filter may not be provided. The air filter may not have the partition wall portion. The air filter may not be attached to the lid portion. The lid portion may be configured to be detachable in any desired way. The partition member may not be provided. A position for disposing the power supply device is not particularly limited. The power supply device may be disposed in the first direction with respect to the light guide system.

The first cooling target and the second cooling target are not particularly limited. The first cooling target and the second cooling target may include at least one of the optical modulator, the optical modulation unit, the light source, a wavelength conversion element that converts a wavelength of the light emitted from the light source, a diffusion element that diffuses the light emitted from the light source, and a polarization conversion element that converts a polarization direction of the light emitted from the light source.

Only one cooling target may be provided for the first cooling target. In this case, the air ejected from the first ejection port of the first fan is not divided, and is fed to one first cooling target. A portion of the first cooling target may not be located in the third direction intersecting with the first direction with respect to the first fan. The plurality of second cooling targets may be provided. In this case, the air ejected from the second ejection port of the second fan may be divided and fed to each of the plurality of second cooling targets. The second cooling target may not be provided. In this case, the second fan is not provided.

The first direction is not particularly limited, and may not be one side in the upward-downward direction. The third direction may be a direction intersecting with the first direction, and may be a direction which is not orthogonal to the first direction. The second direction and the third direction may be an intersecting direction without being orthogonal to each other, or may be directions parallel to each other. The second direction and the third direction may be the same direction.

The projector 1 according to the above-described embodiment is a stationary type projector. However, the projector 1 is not limited thereto. The projector to which the present disclosure is applicable may be a ceiling-mounted projector.

In addition, in the above-described embodiment, a case where the present disclosure is applied to a transmissive-type projector has been described as an example. However, the present disclosure is also applicable to a reflective-type projector.

Here, the "transmissive-type" means that the optical modulator including a liquid crystal panel is a type in which the light is transmitted. The "Reflective-type" means that the optical modulator is a type in which the light is reflected. Without being limited to the liquid crystal panel, the optical modulator may use a micromirror, for example.

In addition, in the above-described embodiment, an example of the projector using the three optical modulators has been described. However, the present disclosure is also applicable to a projector using only one optical modulator, or a projector using four or more optical modulators.

In addition, the respective configurations described in the present specification can be appropriately combined with each other within the scope where the configurations do not contradict each other.

Aspects of the present disclosure are summarized as follows.

Aspect 1

A projector including a cooling target includes a light source that emits light, an optical modulator that modulates the light emitted from the light source in accordance with an image signal, a projection optical device that has a reflection member for reflecting the light modulated by the optical modulator, and projects the light reflected by the reflection member, an exterior housing that forms an exterior of the projector, a first fan that has a first suction port for suctioning air and a first ejection port for ejecting the air suctioned from the first suction port, and a first circulator in which the air suctioned by the first fan circulates.

The exterior housing has
- a first wall portion facing a first direction, and having a projection port through which the light reflected by the reflection member passes,
- a second wall portion located in a direction opposite to the first direction with respect to the first wall portion, and
- a third wall portion facing a second direction orthogonal to the first direction.

The second wall portion has an introduction port for introducing the air present outside the exterior housing into the exterior housing.

The third wall portion has a discharge port for discharging the air present inside the exterior housing to an outside of the exterior housing.

The first circulator is located along the first direction between the second wall portion and the first fan, inside the exterior housing, extends in the first direction, and guides the air introduced into the exterior housing from the introduction port to the first suction port.

The cooling target includes a first cooling target to which the air ejected from the first ejection port is fed.

At least a portion of the first cooling target is located in a third direction intersecting with the first direction with respect to the first fan.

The first ejection port is open in the third direction.

Aspect 2

In the projector according to Aspect 1, the plurality of first cooling targets may be provided.

The air ejected from the first ejection port may be divided and fed to each of the plurality of first cooling targets.

Aspect 3

The projector according to Aspect 1 or 2 may further include a power supply device accommodated inside the exterior housing.

The first cooling target may include the power supply device.

Aspect 4

The projector according to Aspect 3 may further include a light guide system that has the optical modulator, and that guides the light emitted from the light source to the projection optical device.

The light guide system may be located between the light source and the power supply device.

Aspect 5

The projector according to any one of Aspects 1 to 4 may further include a circuit board accommodated inside the exterior housing.

The first cooling target may include the circuit board.

Aspect 6

The projector according to any one of Aspects 1 to 5 may further include a second fan that has a second suction port for suctioning the air ejected from the first ejection port, and a second discharge port for discharging the air suctioned from the second suction port.

The cooling target may include a second cooling target to which the air ejected from the second ejection port is fed.

At least a portion of the first cooling target may be located between the first fan and the second fan.

Aspect 7

In the projector according to Aspect 6, the second cooling target may be disposed along the second direction between the second fan and the third wall portion.

Aspect 8

In the projector according to Aspect 7, an extending direction of a rotation axis of the first fan and an extending direction of a rotation axis of the second fan may be orthogonal to each other.

Aspect 9

The projector according to any one of Aspects 6 to 8 may further include a second circulator that guides the air ejected from the second ejection port to the second cooling target.

Aspect 10

In the projector according to any one of Aspects 6 to 9, the second cooling target may include a rectifier that rectifies a current supplied to the projector.

Aspect 11

The projector according to any one of Aspects 1 to 10 may further include an air filter through which the air introduced into the exterior housing from the introduction port passes.

The air may flow into the first circulator after passing through the air filter.

Aspect 12

The projector according to Aspect 11 may further include a third fan that has a third suction port for suctioning the air introduced into the exterior housing from the introduction port, and a third ejection port for ejecting the air suctioned from the third suction port.

The air ejected from the third ejection port may be fed to the optical modulator.

The air may be suctioned by the third suction port after passing through the air filter.

Aspect 13

The projector according to Aspect 12 may further include a partition member.

The air filter may have
- a first filter portion through which the air flowing into the first circulator passes,
- a second filter portion through which the air suctioned by the third suction port passes, and
- a partition wall portion which partitions the first filter portion and the second filter portion.

The partition member may partition a space between the introduction port and the air filter, into a first space connected to the first suction port via the first filter portion and a second space connected to the third suction port via the second filter portion.

The partition member may be connected to the partition wall portion.

Aspect 14

In the projector according to any one of Aspects 11 to 13, the exterior housing may have a lid portion that forms a portion of the second wall portion.

The lid portion may be attachable to and detachable from the exterior housing.

The introduction port may be provided in the lid portion.

The air filter may be attached to the lid portion.

Aspect 15

In the projector according to Aspect 14, the lid portion may pivot in a direction away from the first wall portion around a pivot axis extending in a direction orthogonal to the first direction, and may be detachable by sliding in a direction orthogonal to both the first direction and the pivot axis.

Aspect 16

In the projector according to Aspect 15, the air filter may be disposed inside the exterior housing to be inclined in a direction closer to the first wall portion along a direction in which the lid portion is slid when the lid portion is detached.

Aspect 17

A projector including a first cooling target includes
- a light source that emits light,
- an optical modulator that modulates the light emitted from the light source in accordance with an image signal, a projection optical device that projects the light modulated by the optical modulator, an exterior housing that has a first wall portion, a second wall portion facing the first wall portion, and a third wall portion orthogonal to the first wall portion and the second wall portion, and that forms an exterior of the projector, and a first fan that has a first suction port for suctioning air and a first ejection port for ejecting the air suctioned from the first suction port.

The second wall portion has an introduction port for introducing the air present outside the exterior housing into the exterior housing.

The third wall portion has a discharge port for discharging the air present inside the exterior housing to an outside of the exterior housing.

The projector further includes a first circulator that connects the introduction port of the second wall portion and the first suction port of the first fan to each other.

At least a portion of the first cooling target is located in the first circulator in a direction intersecting with a direction in which the air flows from the introduction port to the first suction port.

The first ejection port of the first fan is open toward the first cooling target.

Aspect 18

In the projector according to Aspect 17, the first cooling target may be accommodated in a first case.

The first case may include a first opening portion for introducing the air from the first ejection port, and a second opening portion to which the air flowing to the first cooling target is fed.

Aspect 19

In the projector according to Aspect 18, the first cooling target may include another first cooling target to which the air ejected from the first ejection port of the first fan is fed.

Aspect 20

In the projector according to Aspect 19, the air flowing to the other first cooling target may be fed to the second opening portion of the first case.

Aspect 21

The projector according to any one of Aspects 17 to 20 may further include a second fan that has a second suction port for suctioning the air, and a second ejection port for ejecting the air suctioned from the second suction port.

The second suction port may suction the air flowing from the second opening portion of the first case to the first cooling target.

The second ejection port may be open toward the second cooling target.

Aspect 22

In the projector according to Aspect 21, the second ejection port of the second fan may be located in a direction intersecting with a direction in which the air flows from the second opening portion of the first case to the second suction port of the second fan.

Aspect 23

In the projector according to any one of Aspect 17 to 22, the projection optical device may have a reflection member for reflecting the light modulated by the optical modulator, and may project the light reflected by the reflection member.

The first wall portion may have a projection port through which the light reflected by the reflection member passes.

Aspect 24

The projector according to any one of Aspects 18 to 23 may further include a third fan that has a third suction port for suctioning the air introduced into the exterior housing from the introduction port, and a third ejection port for ejecting the air suctioned from the third suction port.

The air ejected from the third ejection port may be fed to the optical modulator.

The air fed to the third suction port from the introduction port may be fed via a space formed by the introduction port and the first case.

Aspect 25

In the projector according to Aspect 24, a length of the first circulator from the introduction port to the first suction port of the first fan may be longer than a length from the introduction port to the first case.

Aspect 26

A projector includes a light source that emits light, an optical modulator that modulates the light emitted from the light source in accordance with an image signal, a projection optical device that projects the light modulated by the optical modulator, an exterior housing that has a first wall portion, a second wall portion facing the first wall portion, and a side wall portion orthogonal to the first wall portion and the second wall portion, and that forms an exterior of the projector, a first fan that has a first suction port for suctioning air and a first ejection port for ejecting the air suctioned from the first suction port, and that feeds the air to a first cooling target from the first ejection port, and a second fan that has a second suction port for suctioning the air and a second ejection port for ejecting the air suctioned from the second suction port, and that feeds the air to a second cooling target from the second discharge port.

The second wall portion has an introduction port for introducing the air present outside the exterior housing into the exterior housing.

The side wall portion has a discharge port that discharges the air present inside the exterior housing to an outside of the exterior housing.

The first ejection port of the first fan is located in a direction intersecting with a direction in which the air flows from the introduction port to the first suction port.

The second ejection port of the second fan is located in a direction intersecting with a direction in which the air fed from the first cooling target flows to the second suction port.

The air fed to the second cooling target is fed to the discharge port.

Aspect 27

In the projector according to Aspect 26, the first cooling target may be accommodated in a first case.

The first case may include a first opening portion for introducing the air from the first ejection port of the first fan, and a second opening portion to which the air flowing to the first cooling target is fed.

Aspect 28

In the projector according to Aspect 27, the first cooling target may include another first cooling target to which the air ejected from the first ejection port of the first fan is fed.

Aspect 29

In the projector according to Aspect 28, the air flowing to the other first cooling target may be fed to the second opening portion of the first case.

Aspect 30

In the projector according to any one of Aspects 26 to 29, the second cooling target may be accommodated in a second case.

The second case may include a first opening portion for introducing the air from the second ejection port of the second fan, and a second opening portion to which the air flowing to the second cooling target is fed.

Aspect 31

In the projector according to Aspect 30, the first case and the second case may be disposed along the side wall portion.

Aspect 32

In the projector according to any one of Aspects 26 to 31, the projection optical device may have a reflection member for reflecting the light modulated by the optical modulator, and may project the light reflected by the reflection member.

The first wall portion may have a projection port through which the light reflected by the reflection member passes.

Aspect 33

The projector according to any one of Aspects 26 to 32 may further include a third fan that has a third suction port for suctioning the air introduced into the exterior housing from the introduction port, and a third ejection port for ejecting the air suctioned from the third suction port.

The air ejected from the third ejection port may be fed to the optical modulator.

The air fed to the third suction port from the introduction port may be fed via a space formed by the introduction port and the first case.

Aspect 34

In the projector according to Aspect 33, a length of the first circulator from the introduction port to the first suction port of the first fan may be longer than a length from the introduction port to the first case.

Aspect 35

A projector including a first cooling target includes
a light source that emits light,
an optical modulator that modulates the light emitted from the light source in accordance with an image signal,
a projection optical device that projects the light modulated by the optical modulator,
an exterior housing that has a first wall portion, a second wall portion facing the first wall portion, a third wall portion orthogonal to the first wall portion and the second wall portion, and a fourth wall portion orthogonal to the second wall portion and the third wall portion, and that forms an exterior of the projector, and
a first fan that has a first suction port for suctioning air and a first ejection port for ejecting the air suctioned from the first suction port.

The second wall portion has an introduction port that introduces the air present outside the exterior housing into the exterior housing.

The third wall portion has a discharge port that discharges the air present inside the exterior housing to an outside of the exterior housing.

The projector further includes a first circulator that connects the introduction port of the second wall portion and the first suction port of the first fan to each other.

At least a portion of the first cooling target is located at the fourth wall portion side with respect to the first circulator.

The first cooling target is fed the air ejected from the first ejection port.

What is claimed is:

1. A projector including a first cooling target, comprising:
a light source that emits light;
an optical modulator that modulates the light emitted from the light source in accordance with an image signal;
at least one projection optical lens that projects the light modulated by the optical modulator;
an exterior housing that has a first wall portion, a second wall portion facing the first wall portion, a third wall portion orthogonal to the first wall portion and the second wall portion, a fourth wall portion facing the third wall portion, a fifth wall portion orthogonal to the first wall portion, the second wall portion, the third wall portion and the fourth wall portion, and a sixth wall portion facing the fifth wall portion, and that forms an exterior of the projector;
a first fan that has a first suction port for suctioning air and a first ejection port for ejecting the air suctioned from the first suction port; and
a third fan that has a third suction port for suctioning the air and a third ejection port for ejecting the air suctioned from the third suction port, wherein
the second wall portion has a leg and an introduction port that introduces the air present outside the exterior housing into the exterior housing,
the third wall portion has a discharge port that discharges the air present inside the exterior housing to an outside of the exterior housing,
a first circulator that connects the introduction port of the second wall portion and the first suction port of the first fan to each other,
the first fan suctions the air into the first suction port through the first circulator from the introduction port of the second wall, and a portion of the first fan overlaps the introduction port and the first circulator viewing a direction facing the first wall portion and the second wall portion to each other,
the first cooling target is located at the sixth wall portion side with respect to the first fan,
the first cooling target is fed the air ejected from the first ejection port, and
the third fan suctions the air into the third suction port from the introduction port of the second wall and feeds to the optical modulator the air ejected from the third ejection port.

2. The projector according to claim 1, wherein
the first cooling target is accommodated in a first case, and
the first case includes a first opening portion which introduces the air from the first ejection port, and a second opening portion to which the air flowing to the first cooling target is fed.

3. The projector according to claim 2, wherein
the first cooling target includes another first cooling target to which the air ejected from the first ejection port of the first fan is fed.

4. The projector according to claim 3, wherein
the air flowing to the other first cooling target is fed to the second opening portion of the first case.

5. The projector according to claim 1, further comprising:
a second fan that has a second suction port for suctioning the air and a second ejection port for ejecting the air suctioned from the second suction port, wherein
the second suction port suctions the air flowing to the first cooling target from a second opening portion of a first case, and
the second ejection port is open toward a second cooling target.

6. The projector according to claim 5, wherein
the second ejection port of the second fan is located in a direction intersecting with a direction in which the air flows from the second opening portion of the first case to the second suction port of the second fan.

7. The projector according to claim 1, wherein
the projection optical device has a reflection member that reflects the light modulated by the optical modulator, and projects the light reflected by the reflection member, and
the first wall portion has a projection port through which the light reflected by the reflection member passes.

8. The projector according to claim 1, further comprising:
an air filter through which the air introduced into the exterior housing from the introduction port passes, wherein
the air flows into the first circulator after passing through the air filter.

9. The projector according to claim 8, wherein
the exterior housing has a lid portion that forms a portion of the second wall portion,
the lid portion is attachable to and detachable from the exterior housing,
the introduction port is provided in the lid portion, and
the air filter is attached to the lid portion.

10. The projector according to claim 9, wherein
the air filter is disposed inside the exterior housing to be inclined in a direction closer to the first wall portion along a direction in which the lid portion is slid when the lid portion is detached.

11. The projector according to claim 2, further comprising:
a third fan that has a third suction port for suctioning the air introduced into the exterior housing from the introduction port, and a third ejection port for ejecting the air suctioned from the third suction port, wherein
the air ejected from the third ejection port is fed to the optical modulator, and
the air fed to the third suction port from the introduction port is fed via a space formed by the introduction port and the first case.

12. The projector according to claim 11, wherein
a length of the first circulator from the introduction port to the first suction port of the first fan is longer than a length from the introduction port to the first case.

13. A projector comprising:
a light source that emits light;
an optical modulator that modulates the light emitted from the light source in accordance with an image signal;
at least one projection optical lens that projects the light modulated by the optical modulator;
an exterior housing that has a first wall portion, a second wall portion facing the first wall portion, a third wall portion orthogonal to the first wall portion and the second wall portion, a fourth wall portion facing the third wall portion, a fifth wall portion orthogonal to the first wall portion, the second wall portion, the third wall portion and the fourth wall portion, and a sixth wall portion facing the fifth wall portion, and that forms an exterior of the projector;
a first fan that has a first suction port for suctioning air and a first ejection port for ejecting the air suctioned from the first suction port, and that feeds the air to a first cooling target from the first ejection port; and
a second fan that has a second suction port for suctioning the air and a second ejection port for ejecting the air suctioned from the second suction port, and that feeds the air to a second cooling target from the second ejection port, wherein
the first wall portion has a projection port,
the second wall portion has a leg and an introduction port that introduces the air present outside the exterior housing into the exterior housing,
the third wall portion has a discharge port that discharges the air present inside the exterior housing to an outside of the exterior housing,
a first duct connects between the introduction port of the second wall and the first suction port of the first fan,
the first fan suctions the air into the first suction port through the first circulator from the introduction port of the second wall, and a portion of the first fan overlaps the introduction port and the first circulator viewing a direction facing the first wall portion and the second wall portion to each other,
the first ejection port of the first fan is located in a direction intersecting with a direction in which the air flows from the introduction port to the first suction port,
a first case positions at the fourth wall side, accommodates the first cooling target and includes a first opening portion for introducing the air from the first ejection port of the first fan and a second opening portion to which the air flowing to the first cooling target is fed,
the second ejection port of the second fan is located in a direction intersecting with a direction in which the air fed from the first cooling target flows to the second suction port,
a second duct positions at the sixth wall side and connects between the second ejection port of the second fan and the second cooling target, and
the air fed to the second cooling target is fed to the discharge port.

14. The projector according to claim 13, wherein
the first cooling target has another first cooling target to which the air ejected from the first ejection port of the first fan is fed.

15. The projector according to claim 14, wherein
the air flowing to the other first cooling target is fed to the second opening portion of the first case.

16. The projector according to claim 13, wherein
the second cooling target is accommodated in a second case, and
the second case includes a first opening portion for introducing the air from the second ejection port of the second fan, and a second opening portion to which the air flowing to the second cooling target is fed.

17. The projector according to claim 16, wherein
the first case and the second case are disposed along the side wall portion.

18. The projector according to claim 13, wherein
the projection optical device has a reflection member that reflects the light modulated by the optical modulator, and projects the light reflected by the reflection member, and
the first wall portion has a projection port through which the light reflected by the reflection member passes.

19. The projector according to claim 13, further comprising:
a third fan that has a third suction port for suctioning the air introduced into the exterior housing from the introduction port, and a third ejection port for ejecting the air suctioned from the third suction port, wherein
the air ejected from the third ejection port is fed to the optical modulator, and the air fed from the introduction port to the third suction port is fed via a space formed by the first case and the introduction port.

* * * * *